US011164757B2

(12) United States Patent
Xu et al.

(10) Patent No.: US 11,164,757 B2
(45) Date of Patent: Nov. 2, 2021

(54) SUBSTRATE CLEANING DEVICE AND SUBSTRATE CLEANING METHOD

(71) Applicant: EBARA CORPORATION, Tokyo (JP)

(72) Inventors: Haiyang Xu, Tokyo (JP); Mitsuhiko Inaba, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 54 days.

(21) Appl. No.: 16/503,868

(22) Filed: Jul. 5, 2019

(65) Prior Publication Data

US 2020/0013640 A1 Jan. 9, 2020

(30) Foreign Application Priority Data

Jul. 6, 2018 (JP) .............................. JP2018-129086

(51) Int. Cl.
*H01L 21/67* (2006.01)
*B08B 1/00* (2006.01)
(Continued)

(52) U.S. Cl.
CPC ........ *H01L 21/67046* (2013.01); *B08B 1/003* (2013.01); *B08B 1/006* (2013.01);
(Continued)

(58) Field of Classification Search
CPC ......... H01L 21/67046; H01L 21/02096; H01L 21/67219; H01L 21/02013; H01L 21/67092; H01L 21/304; H01L 21/30625; H01L 21/02041; B08B 1/002; B08B 1/003; B08B 1/005; B08B 1/006; B08B 1/04;
(Continued)

(56) References Cited

U.S. PATENT DOCUMENTS

2002/0029431 A1* 3/2002 Oikawa ..................... B08B 3/04
15/77
2013/0098397 A1* 4/2013 Wang ................ H01L 21/67051
134/6
(Continued)

FOREIGN PATENT DOCUMENTS

JP H10-177977 A 6/1998
JP H10229063 A * 8/1998
(Continued)

*Primary Examiner* — Mikhail Kornakov
*Assistant Examiner* — Richard Z. Zhang
(74) *Attorney, Agent, or Firm* — BakerHostetler

(57) ABSTRACT

A substrate cleaning device includes: a pressing member that cleans a substrate by contacting the substrate; a load measurement unit that measures a pressing load of the cleaning member; and a control unit that repeats an operation of comparing the measurement value of the load measurement unit with the setting load, changing the pressing amount of the cleaning member by a first movement amount so that a difference value decreases, when the difference value is larger than a first threshold value and equal to or smaller than a second threshold value, and changing the pressing amount of the cleaning member by a second movement amount larger than the first movement amount so that the difference value decreases, when the difference value is larger than the second threshold value, until the difference value becomes equal to or smaller than the first threshold value.

5 Claims, 15 Drawing Sheets

(51) Int. Cl.
  *B08B 1/04* (2006.01)
  *B24B 37/04* (2012.01)
  *H01L 21/02* (2006.01)
  *B24B 37/34* (2012.01)
(52) U.S. Cl.
  CPC ............... *B08B 1/04* (2013.01); *B24B 37/04* (2013.01); *B24B 37/34* (2013.01); *H01L 21/02096* (2013.01); *H01L 21/67219* (2013.01)
(58) Field of Classification Search
  CPC .............. A46B 13/001; A46B 15/0002; A46B 15/0004; A46B 15/0012; A46B 2200/30; B24B 37/04; B24B 37/042
  See application file for complete search history.

(56) References Cited

U.S. PATENT DOCUMENTS

2015/0221531 A1* 8/2015 Tanaka ..................... B08B 1/006
  15/102
2016/0243592 A1 8/2016 Tanaka

FOREIGN PATENT DOCUMENTS

| JP | 2006-324429 A | 11/2006 |
| JP | 2014-038983 A | 2/2014 |

\* cited by examiner

FIG.7A

MASTER DATA

| PRESSING LOAD [N] | 2 | 4 | 6 | 8 | 10 | 12 |
|---|---|---|---|---|---|---|
| PRESSING AMOUNT [μm] | 200 | 400 | 600 | 800 | 1000 | 1200 |

FIG.7B

MEASUREMENT DATA

| PRESSING LOAD [N] | 2 | 4 | 6 | 8 | 10 | 12 |
|---|---|---|---|---|---|---|
| PRESSING AMOUNT [μm] | 250 |  | 650 |  | 1050 |  |

FIG.7C

DATA FOR MOVEMENT AMOUNT CALCULATION

| PRESSING LOAD [N] | 2 | 4 | 6 | 8 | 10 | 12 |
|---|---|---|---|---|---|---|
| PRESSING AMOUNT [μm] | 250 | 450 | 650 | 850 | 1050 | 1250 |

SUBSTRATE CLEANING DEVICE AND SUBSTRATE CLEANING METHOD

CROSS-REFERENCE TO RELATED APPLICATIONS

This application claims the benefit of Japanese Priority Patent Application JP 2018-129086 filed on Jul. 6, 2018, the entire contents of which are incorporated herein by reference.

FIELD

The present technology relates to a substrate cleaning device and a substrate cleaning method.

BACKGROUND AND SUMMARY

At the present time, with the miniaturization of a semiconductor device, processing of a substrate having a fine structure (a substrate on which various material films having different physical properties are formed) is performed. For example, in a damascene wiring formation step of filling a wiring groove formed in the substrate with a metal, the excess metal is polished and removed by a substrate polishing device (CMP device) after damascene wiring formation, and the various material films (a metal film, a barrier film, an insulating film, and the like) having the different physical properties are formed on a surface of the substrate. On the surface of the substrate, there are slurry residue and metal polishing waste (Cu polishing waste and the like) used in CMP polishing. For this reason, when the surface of substrate is not sufficiently cleaned, such as when the surface of the substrate is complicated and cleaning is difficult, leaks and adhesion defects occur due to an influence of the residue and the like, which may result in a decrease in reliability. Therefore, in the CMP device for polishing the semiconductor substrate, roll member scrub cleaning and pen member scrub cleaning are performed in a cleaning step after polishing.

For the roll member scrub cleaning, technology for installing a load cell measuring a pressing load of a roll member between a lift arm moving upward and downward according to driving of an air cylinder and a roll member holder and performing feedback control on the pressing load of the roll member via a control device of the air cylinder on the basis of a measurement value of the load cell is known (refer to JP 2014-38983 A).

Incidentally, in recent years, since a substrate thickness decreases or a substrate material changes, further improvement in the accuracy of the pressing load for the substrate is required.

Accordingly, it is desirable to provide a substrate cleaning device and a substrate cleaning method capable of improving accuracy of a pressing load.

A substrate cleaning device according to an embodiment includes: a cleaning member that cleans a substrate by contacting the substrate; a member rotation unit that rotates the cleaning member; a member drive unit that presses the cleaning member against the substrate; a load measurement unit that measures a pressing load of the cleaning member; and a control unit that controls a pressing amount of the cleaning member by the member drive unit, on the basis of a measurement value of the load measurement unit, so that the pressing load of the cleaning member becomes a setting load, wherein the control unit repeats an operation of comparing the measurement value of the load measurement unit with the setting load, changing the pressing amount of the cleaning member by a first movement amount so that a difference value decreases, when the difference value is larger than a first threshold value and equal to or smaller than a second threshold value, and changing the pressing amount of the cleaning member by a second movement amount larger than the first movement amount so that the difference value decreases, when the difference value is larger than the second threshold value, until the difference value becomes equal to or smaller than the first threshold value.

BRIEF DESCRIPTION OF DRAWINGS

FIG. 7A is a diagram showing an example of master data;

FIG. 7B is a diagram showing an example of measurement data;

FIG. 7C is a diagram showing an example of data for movement amount calculation;

DETAILED DESCRIPTION OF NON-LIMITING EXAMPLE EMBODIMENTS

Figure 1:
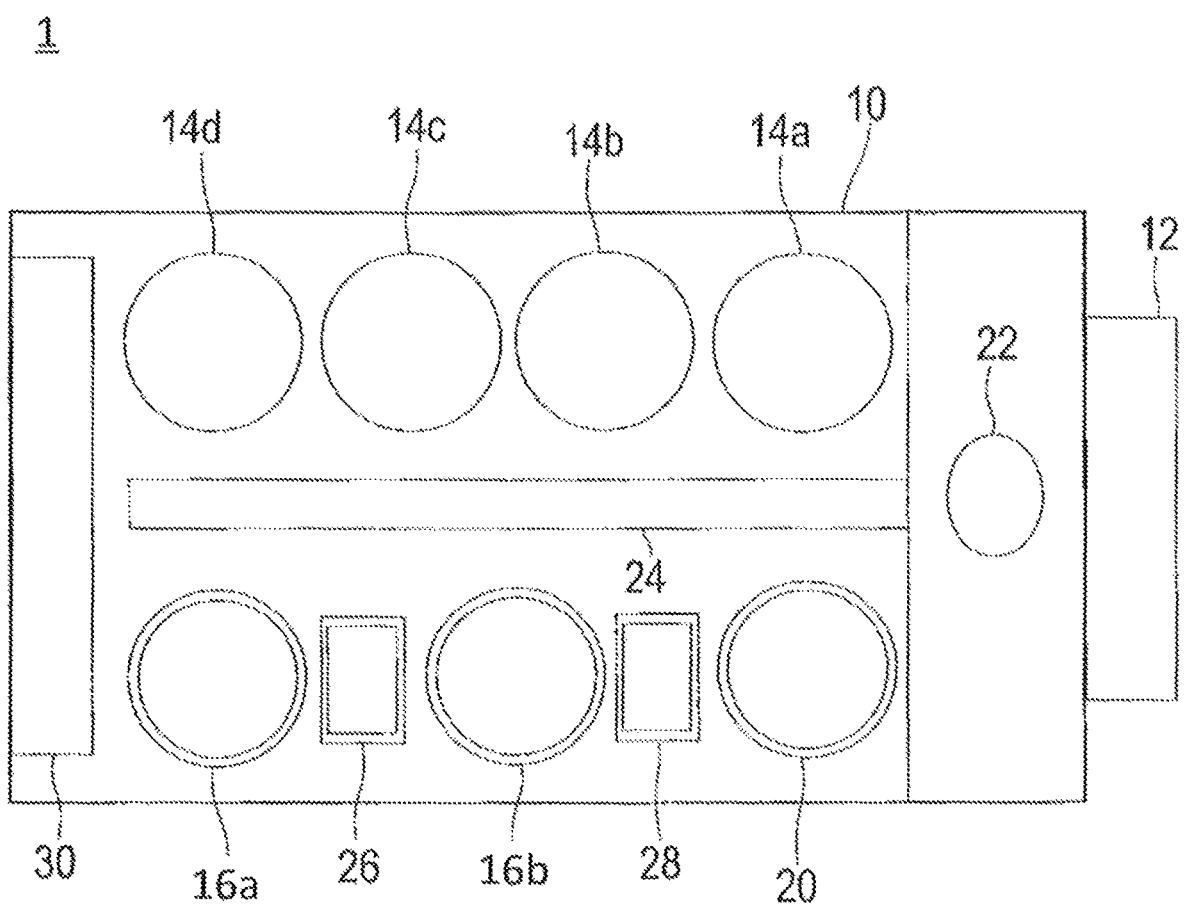
FIG. 1 is a plan view showing an example of an entire configuration of a substrate processing apparatus according to an embodiment.

A substrate cleaning device according to a first aspect of an embodiment includes: a cleaning member that cleans a substrate by contacting the substrate; a member rotation unit that rotates the cleaning member; a member drive unit that presses the cleaning member against the substrate; a load measurement unit that measures a pressing load of the cleaning member; and a control unit that controls a pressing amount of the cleaning member by the member drive unit, on the basis of a measurement value of the load measurement unit, so that the pressing load of the cleaning member becomes a setting load, wherein the control unit repeats an operation of comparing the measurement value of the load measurement unit with the setting load, changing the pressing amount of the cleaning member by a first movement amount so that a difference value decreases, when the difference value is larger than a first threshold value and equal to or smaller than a second threshold value, and changing the pressing amount of the cleaning member by a second movement amount larger than the first movement amount so that the difference value decreases, when the difference value is larger than the second threshold value, until the difference value becomes equal to or smaller than the first threshold value.

According to the first aspect, when the difference value between the measurement value of the load measurement unit and the setting load is larger than the first threshold value and equal to or smaller than the second threshold value, the control unit changes the pressing amount of the cleaning member by the first movement amount. However, when the difference value is larger than the second threshold value, the control unit changes the pressing amount of the cleaning member by the second movement amount larger than the first movement amount (that is, closed loop control of two steps). As a result, as compared with a method (that is, closed loop control of one step) of changing the pressing amount of the cleaning member by the first movement amount even when the difference value is larger than the second threshold value, it is possible to shorten a time until the difference value converges to the first threshold value or less, which can lead to an increase in the number of substrates processed per unit time (wph; wafer per hour). Further, as compared with a method (that is, closed loop control of one step) of changing the pressing amount of the cleaning member by the second movement amount even when the difference value is equal to or smaller than the second threshold value, the pressing amount can be controlled with high accuracy. As a result, accuracy of the pressing load can be improved.

A substrate cleaning device according to a second aspect of the embodiment includes: a cleaning member that cleans a substrate by contacting the substrate; a member rotation unit that rotates the cleaning member; a member drive unit that presses the cleaning member against the substrate; a load measurement unit that measures a pressing load of the cleaning member; and a control unit that controls a pressing amount of the cleaning member by the member drive unit, on the basis of a measurement value of the load measurement unit, so that the pressing load of the cleaning member becomes a setting load, wherein the control unit previously stores a correspondence relation between the pressing load and the pressing amount of the cleaning member for M (M is a natural number of 2 or more) pressing loads as master data, the control unit acquires the correspondence relation between the pressing load and the pressing amount of the cleaning member for N (N is a natural number smaller than M) pressing loads among the M pressing loads as measurement data, on the basis of the measurement value of the load measurement unit, the control unit corrects each of pressing amounts corresponding to the M pressing loads in the master data, on the basis of the measurement data, so that the correspondence relation between the pressing load and the pressing amount for the N pressing loads in the master data approaches the correspondence relation between the pressing load and the pressing amount for the N pressing loads in the measurement data, and generates data for movement amount calculation showing the correspondence relation between the pressing load and the pressing amount for the M pressing loads, and the control unit calculates the pressing amount of the cleaning member corresponding to the setting load, on the basis of the correspondence relation between the pressing load and the pressing amount in the data for movement amount calculation.

According to the second aspect, the control unit corrects the correspondence relation between the pressing load and the pressing amount in the master data, on the basis of the measurement data, and calculates the pressing amount of the cleaning member, on the basis of the correspondence relation (=data for movement amount calculation) after correction. Therefore, the control unit can determine the pressing amount with high accuracy as compared with the case where the pressing amount of the cleaning member is calculated on the basis of the correspondence relation (=master data) before correction. As a result, accuracy of the pressing load can be improved.

According to a substrate cleaning device according to a third aspect of the embodiment, in the substrate cleaning device according to the first or second aspect, the cleaning member is any one member of the group consisting of a roll cleaning member, a pencil cleaning member, and a buff cleaning/polishing member.

According to a substrate cleaning device according to a fourth aspect of the embodiment, in the substrate cleaning device according to any one of the first to third aspects, the member drive unit is an electric actuator.

According to the fourth aspect, the pressing amount of the cleaning member can be controlled with high accuracy as compared with the case where an air cylinder is adopted as the member drive unit. As a result, accuracy of the pressing load can be further improved.

A substrate cleaning device according to a fifth aspect of the embodiment includes: a first cleaning member that cleans a first surface of a substrate by contacting the first surface of the substrate; a first member rotation unit that rotates the first cleaning member; a first member drive unit that presses the first cleaning member against the first surface of the substrate; a first load measurement unit that measures a pressing load of the first cleaning member; a second cleaning member that cleans a second surface of the substrate by contacting the second surface of the substrate; a second member rotation unit that rotates the second cleaning member; a second member drive unit that presses the second cleaning member against the second surface of the substrate; a second load measurement unit that measures a pressing load of the second cleaning member; and a control unit that controls a pressing amount of the first cleaning member by the first member drive unit and a pressing amount of the second cleaning member by the second member drive unit, on the basis of a measurement value of the first load measurement unit and a measurement value of the second load measurement unit, so that the pressing load of the first cleaning member becomes a first setting load and the pressing load of the second cleaning member becomes a second setting load, wherein the control unit is configured to execute a first step of controlling the first member drive unit and the second member drive unit so that the first cleaning member moves at a first movement speed from a first initial position separated from the first surface of the substrate by a first distance to a first proximity position separated from the first surface by a third distance and the second cleaning member moves at a second movement speed from a second initial position separated from the second surface of the substrate by a second distance shorter than the first distance to a second proximity position separated from the second surface by the third distance and a second step of controlling the first member drive unit and the second member drive unit so that the first cleaning member and the second cleaning member simultaneously start moving at a third movement speed lower than the first movement speed and simultaneously contact the first surface and the second surface of the substrate, respectively, and the control unit is configured to determine the second movement speed of the second cleaning member by the second member drive unit, on the basis of the first movement speed of the first cleaning member by the first member drive unit, so that the first cleaning member disposed at the first initial position and the second cleaning member disposed at the second initial position simultaneously start the moving and the second cleaning member reaches the second proximity position at timing identical to timing when the first cleaning member reaches the first proximity position, before the first step.

According to the fifth aspect, the second movement speed of the second cleaning member disposed at the second initial position relatively close to the substrate is determined on the basis of the first movement speed of the first cleaning member disposed at the first initial position relatively far from the substrate. Therefore, it is possible to shorten a time required for causing the first cleaning member and the second cleaning member to reach the first proximity position and the second proximity position, respectively. As a result, it is possible to increase the number of substrates processed per unit time (wph; wafer per hour). Further, the first cleaning member and the second cleaning member respectively disposed at the first proximity position and the second proximity position having the same distances from the substrate are moved symmetrically with respect to the substrate and the first cleaning member and the second cleaning member are simultaneously contacted with the substrate. Therefore, it is possible to simultaneously and accurately position the first cleaning member and the second cleaning member on the surfaces of the substrate. As a result, subsequent pressing amount control can be performed with high accuracy, and accuracy of the pressing load can be improved.

According to a substrate cleaning device according to a sixth aspect of the embodiment, in the substrate cleaning device according to the fifth aspect, each of the first cleaning member and the second cleaning member is a roll cleaning member.

According to a substrate cleaning device according to a seventh aspect of the embodiment, in the substrate cleaning device according to the fifth or sixth aspect, each of the first member drive unit and the second member drive unit is an electric actuator.

According to the seventh aspect, the pressing amounts of the first cleaning member and the second cleaning member can be controlled with high accuracy, as compared with the case where air cylinders are adopted as the first member drive unit and the second member drive unit. As a result, accuracy of the pressing load can be further improved.

A substrate processing apparatus according to an eighth aspect of the embodiment includes the substrate cleaning device according to any one of the first to seventh aspects.

A substrate cleaning method according to a ninth aspect of the embodiment includes: a step of causing a member drive unit to press a cleaning member against a substrate; a step of causing a load measurement unit to measure a pressing load of the cleaning member; and a step of causing a control unit to control a pressing amount of the cleaning member by the member drive unit, on the basis of a measurement value of the load measurement unit, so that the pressing load of the cleaning member becomes a setting load, wherein, in the step of controlling the pressing amount, the control unit repeats an operation of comparing the measurement value of the load measurement unit with the setting load, changing the pressing amount of the cleaning member by a first movement amount so that a difference value decreases, when the difference value is larger than a first threshold value and equal to or smaller than a second threshold value, and changing the pressing amount of the cleaning member by a second movement amount larger than the first movement amount so that the difference value decreases, when the difference value is larger than the second threshold value, until the difference value becomes equal to or smaller than the first threshold value.

A substrate cleaning method according to a tenth aspect of the embodiment includes: a step of causing a control unit to calculate a pressing amount of a cleaning member corresponding to a setting load; a step of causing a member drive unit to press the cleaning member against a substrate by the calculated pressing amount; a step of causing a load measurement unit to measure a pressing load of the cleaning member; and a step of causing a control unit to control the pressing amount of the cleaning member by the member drive unit, on the basis of a measurement value of the load measurement unit, so that the pressing load of the cleaning member becomes the setting load, wherein the control unit previously stores a correspondence relation between the pressing load and the pressing amount of the cleaning member for M (M is a natural number of 2 or more) pressing loads as master data, and in the step of calculating the pressing amount, the control unit acquires the correspondence relation between the pressing load and the pressing amount of the cleaning member for N (N is a natural number smaller than M) pressing loads among the M pressing loads as measurement data, on the basis of the measurement value of the load measurement unit, the control unit corrects each of pressing amounts corresponding to the M pressing loads in the master data, on the basis of the measurement data, so that the correspondence relation between the pressing load and the pressing amount for the N pressing loads in the master data approaches the correspondence relation between the pressing load and the pressing amount for the N pressing loads in the measurement data, and generates data for movement amount calculation showing the correspondence relation between the pressing load and the pressing amount for the M pressing loads, and the control unit calculates the pressing amount of the cleaning member corresponding to the setting load, on the basis of the correspondence relation between the pressing load and the pressing amount in the data for movement amount calculation.

According to a substrate cleaning method according to an eleventh aspect of the embodiment, in the substrate cleaning method according to the ninth or tenth aspect, the cleaning member is any one member of the group consisting of a roll cleaning member, a pencil cleaning member, and a buff cleaning/polishing member.

According to a substrate cleaning method according to a twelfth aspect of the embodiment, in the substrate cleaning method according to any one of the ninth to eleventh aspects, the member drive unit is an electric actuator.

A substrate cleaning method according to a thirteenth aspect of the embodiment includes: a step of causing a first member drive unit to contact a first cleaning member with a first surface of a substrate and causing a second member drive unit to contact a second cleaning member with a second surface of the substrate; a step of causing the first member drive unit to press the first cleaning member against the first surface of the substrate and causing the second member drive unit to press the second cleaning member against the second surface of the substrate; a step of causing a first load measurement unit to measure a pressing load of the first cleaning member and causing a second load measurement unit to measure a pressing load of the second cleaning member; and a step of causing a control unit to control each of a pressing amount of the first cleaning member by the first member drive unit and a pressing amount of the second cleaning member by the second member drive unit, on the basis of a measurement value of the first load measurement unit and a measurement value of the second load measurement unit, so that the pressing load of the first cleaning member becomes a first setting load and the pressing load of the second cleaning member becomes a second setting load, wherein the step of contacting the first cleaning member and the second cleaning member with the substrate includes a first step of causing the control unit to control the first member drive unit and the second member drive unit so that the first cleaning member moves at a first movement speed from a first initial position separated from the first surface of the substrate by a first distance to a first proximity position separated from the first surface by a third distance and the second cleaning member moves at a second movement speed from a second initial position separated from the second surface of the substrate by a second distance shorter than the first distance to a second proximity position separated from the second surface by the third distance and a second step of causing the control unit to control the first member drive unit and the second member drive unit so that the first cleaning member and the second cleaning member simultaneously start moving at a third movement speed lower than the first movement speed and simultaneously contact the first surface and the second surface of the substrate, respectively, and the control unit determines the second movement speed of the second cleaning member, on the basis of the first movement speed of the first cleaning member, so that the first cleaning member disposed at the first initial position and the second cleaning member disposed at the second initial position simultaneously start the moving and the second cleaning member reaches the second proximity position at timing identical to timing when the first cleaning member reaches the first proximity position, before the first step.

According to a substrate cleaning method according to a fourteenth aspect of the embodiment, in the substrate cleaning method according to the thirteenth aspect, each of the first cleaning member and the second cleaning member is a roll cleaning member.

According to a substrate cleaning method according to a fifteenth aspect of the embodiment, in the substrate cleaning method according to the thirteenth or fourteenth aspect, each of the first member drive unit and the second member drive unit is an electric actuator.

Hereinafter, specific examples of an embodiment will be described in detail with reference to the accompanying drawings. In the following description and the drawings used in the following description, the same reference numerals will be used for parts that can be configured in the same way, and redundant descriptions will be omitted.

<Substrate Processing Apparatus>

FIG. 1 is a plan view showing an entire configuration of a substrate processing apparatus 1 according to an embodiment.

As shown in FIG. 1, the substrate processing apparatus 1 has a substantially rectangular housing 10 and a load port 12 on which a substrate cassette (not shown in the drawings) for stocking a plurality of substrates W (refer to FIG. 2 or the like) is placed. The load port 12 is disposed to be adjacent to the housing 10. The load port 12 can be equipped with an open cassette, a standard manufacturing interface (SMIF) pod, or a front opening unified pod (FOUP). The SMIF pod and the FOUP are closed containers that can maintain the environment independent of an external space by accommodating the substrate cassette inside and covering the substrate cassette with a partition wall. As the substrate W, for example, a semiconductor wafer or the like can be mentioned.

In the housing 10, a plurality of (four in an aspect shown in FIG. 1) substrate polishing devices 14a to 14d, a first substrate cleaning device 16a and a second substrate cleaning device 16b for cleaning the substrate W after polishing, and a substrate drying device 20 for drying the substrate W after cleaning are accommodated. The substrate polishing devices 14a to 14d are arranged along a longitudinal direction of the housing 10, and the substrate cleaning devices 16a and 16b and the substrate drying device 20 are also arranged along the longitudinal direction of the housing 10.

A first transfer robot 22 is disposed in a region surrounded by the load port 12, the substrate polishing device 14a located at the side of the load port 12, and the substrate drying device 20. Further, a transfer unit 24 is disposed in parallel with the longitudinal direction of the housing 10, between a region where the substrate polishing devices 14a to 14d are arranged and a region where the substrate cleaning devices 16a and 16b and the substrate drying device 20 are arranged. The first transfer robot 22 receives the substrate W before polishing from the load port 12 and transfers the substrate W to the transfer unit 24 or receives the dried substrate W extracted from the substrate drying device 20 from the transfer unit 24.

A second transfer robot 26 for transferring the substrate W between the first substrate cleaning device 16a and the second substrate cleaning device 16b is disposed between the first substrate cleaning device 16a and the second substrate cleaning device 16b. Further, a third transfer robot 28 for transferring the substrate W between the second substrate cleaning device 16b and the substrate drying device 20 is disposed between the second substrate cleaning device 16b and the substrate drying device 20.

Further, the substrate processing apparatus 1 is provided with a control panel 30 for controlling the movement of each of the devices 14a to 14d, 16a, 16b, 22, 24, 26, and 28. In the aspect shown in FIG. 1, although the control panel 30 is disposed inside the housing 10, the control panel 30 is not limited thereto and may be disposed outside the housing 10.

As the first substrate cleaning device 16a and/or the second substrate cleaning device 16b, a roll cleaning device (a substrate cleaning device 16 according to a first embodiment or a substrate cleaning device 16' according to a second embodiment to be described later) that contacts a roll cleaning member extending linearly over substantially an entire length of a diameter of the substrate W with a surface of the substrate W in the presence of a cleaning liquid and scrub-cleans the surface of the substrate W while rotating the roll cleaning member may be used, a pencil cleaning device (substrate cleaning device 16 according to a first modification of the first embodiment to be described later) that contacts a columnar pencil cleaning member extending in a vertical direction with the surface of the substrate W in the presence of the cleaning liquid, moves the pencil cleaning member in one direction parallel to the surface of the substrate W while rotating the pencil cleaning member, and scrub-cleans the surface of the substrate W may be used, a buff cleaning/polishing device (substrate cleaning device 16 according to a second modification of the first embodiment to be described later) that contacts a buff cleaning/polishing member with a rotation axis extending in a vertical direction with the surface of the substrate W in the presence of the cleaning liquid, moves the buff cleaning/polishing member in one direction parallel to the surface of the substrate W while rotating the buff cleaning/polishing member, and scrub-cleans and polishes the surface of the substrate W may be used, and a two-fluid jet cleaning device that cleans the surface of the substrate W by a two-fluid jet may be used. Further, as the first substrate cleaning device 16a and/or the second substrate cleaning device 16b, any combination of two or more devices of the roll cleaning device, the pencil cleaning device, the buff cleaning/polishing device, and the two-fluid jet cleaning device may be used.

The cleaning liquid includes a rinse liquid such as pure water (DIW) and a chemical liquid such as ammonia hydrogen peroxide (SC1), hydrochloric acid hydrogen peroxide (SC2), sulfuric acid hydrogen peroxide (SPM), sulfuric acid hydration, or hydrofluoric acid. Unless otherwise noted in the present embodiment, the cleaning liquid means either the rinse liquid or the chemical liquid.

As the substrate drying device 20, a spin drying device that jets IPA vapor from an injection nozzle moving in one direction parallel to the surface of the substrate W toward the rotating substrate W to dry the substrate W and rotates the substrate W at high speed to dry the substrate W by a centrifugal force may be used.

Substrate Cleaning Device According to First Embodiment

Figure 2:
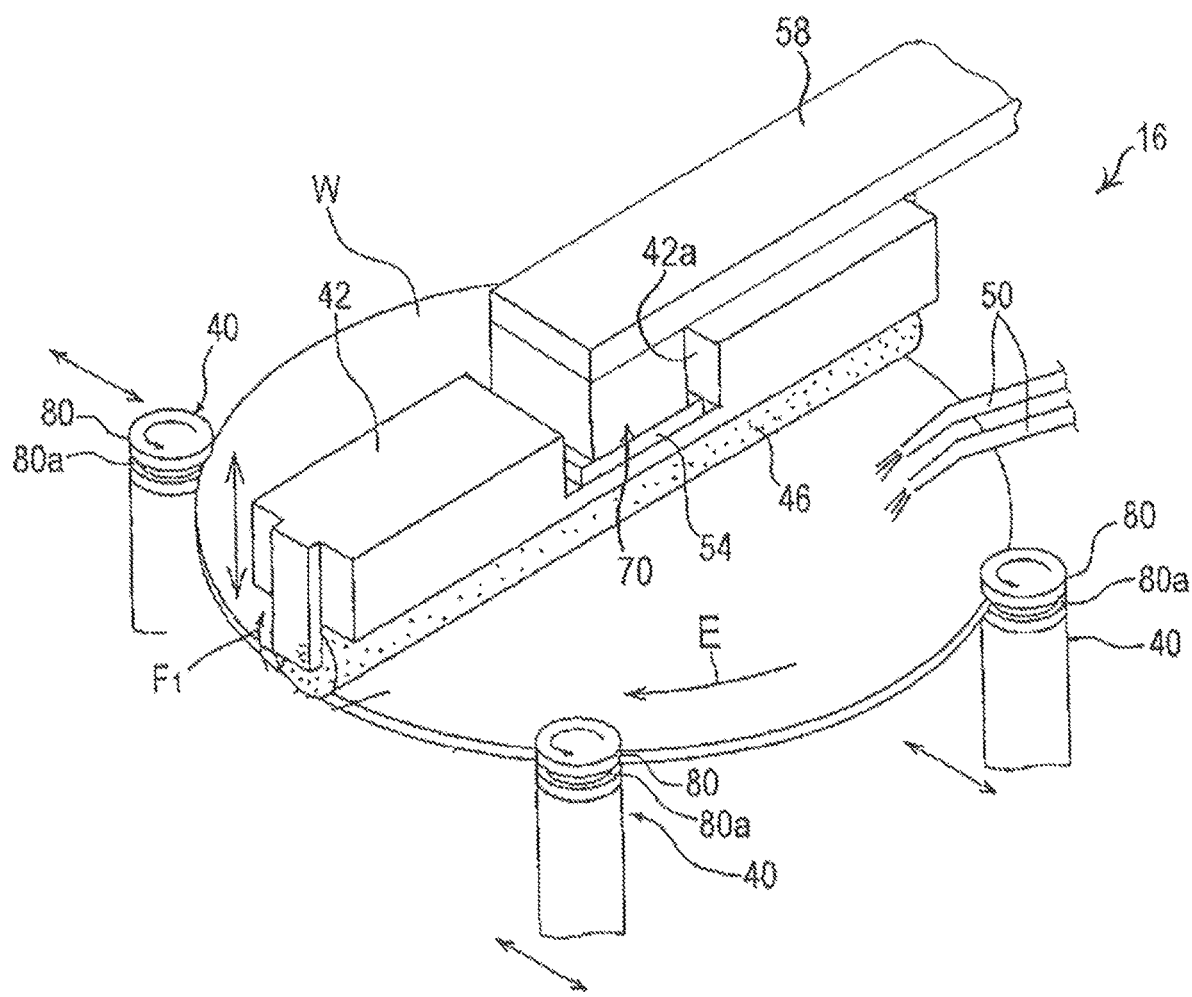
FIG. 2 is a perspective view showing a substrate cleaning device according to a first embodiment.
Figure 3:
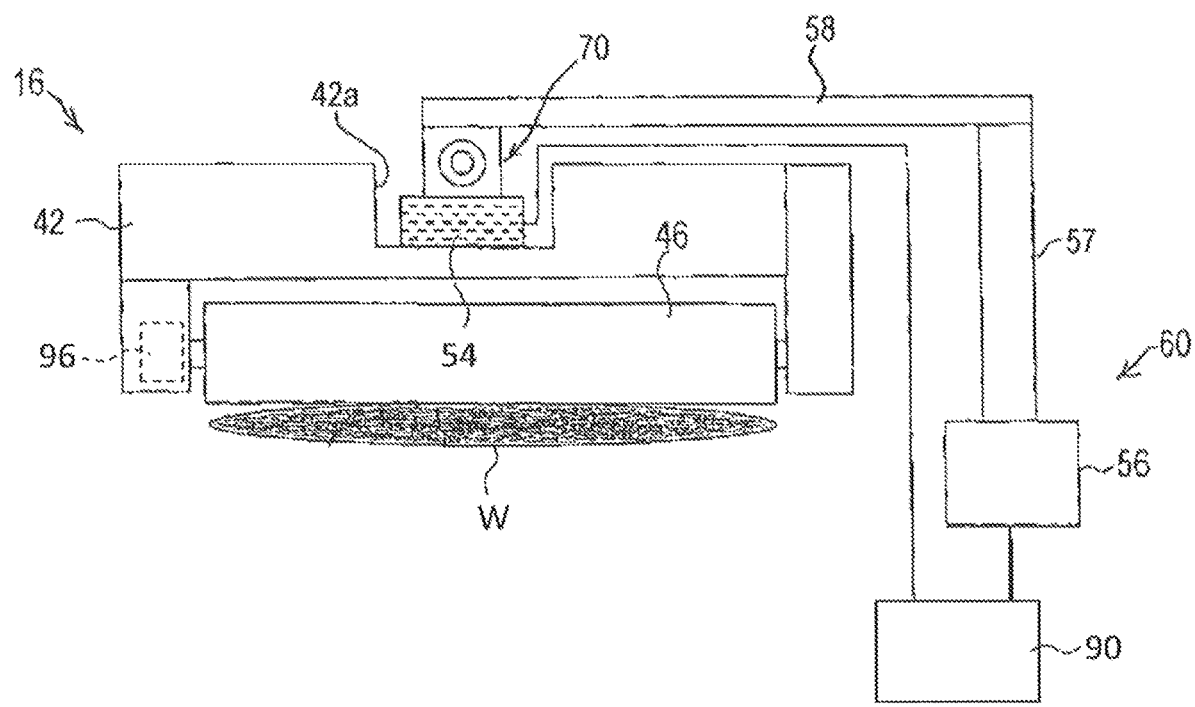
FIG. 3 is a diagram showing a schematic configuration of the substrate cleaning device according to the first embodiment.

Next, a substrate cleaning device 16 according to the first embodiment will be described. FIG. 2 is a perspective view showing the substrate cleaning device 16 according to the first embodiment and FIG. 3 is a diagram showing a schematic configuration of the substrate cleaning device 16 according to the first embodiment. The substrate cleaning device 16 according to the first embodiment may be used as the first substrate cleaning device 16a and/or the second substrate cleaning device 16b in the substrate processing apparatus 1 described above.

As shown in FIGS. 2 and 3, the substrate cleaning device 16 has a cleaning member 46 that cleans a substrate W by contacting the substrate W, a member rotation unit 96 that rotates the cleaning member 46, a member drive unit 56 that presses the cleaning member 46 against the substrate W, a load measurement unit 54 that measures a pressing load of the cleaning member 46, and a control unit 90 that controls a pressing amount of the cleaning member 46 by the member drive unit 56, on the basis of a measurement value of load measurement unit 54, so that the pressing load of the cleaning member 46 becomes a setting load.

Figure 13:
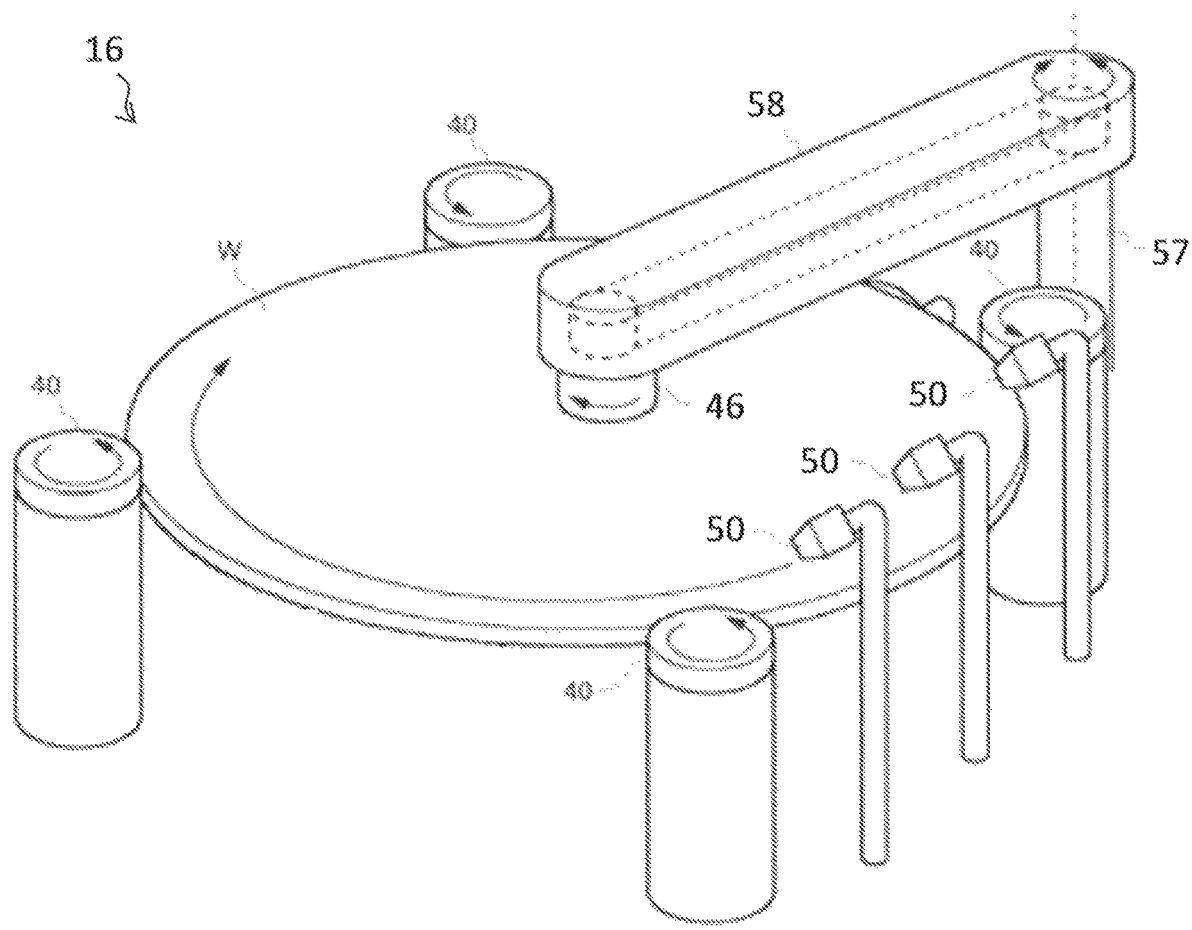
FIG. 13 is a perspective view showing a substrate cleaning device according to a first modification of the first embodiment.
Figure 14:
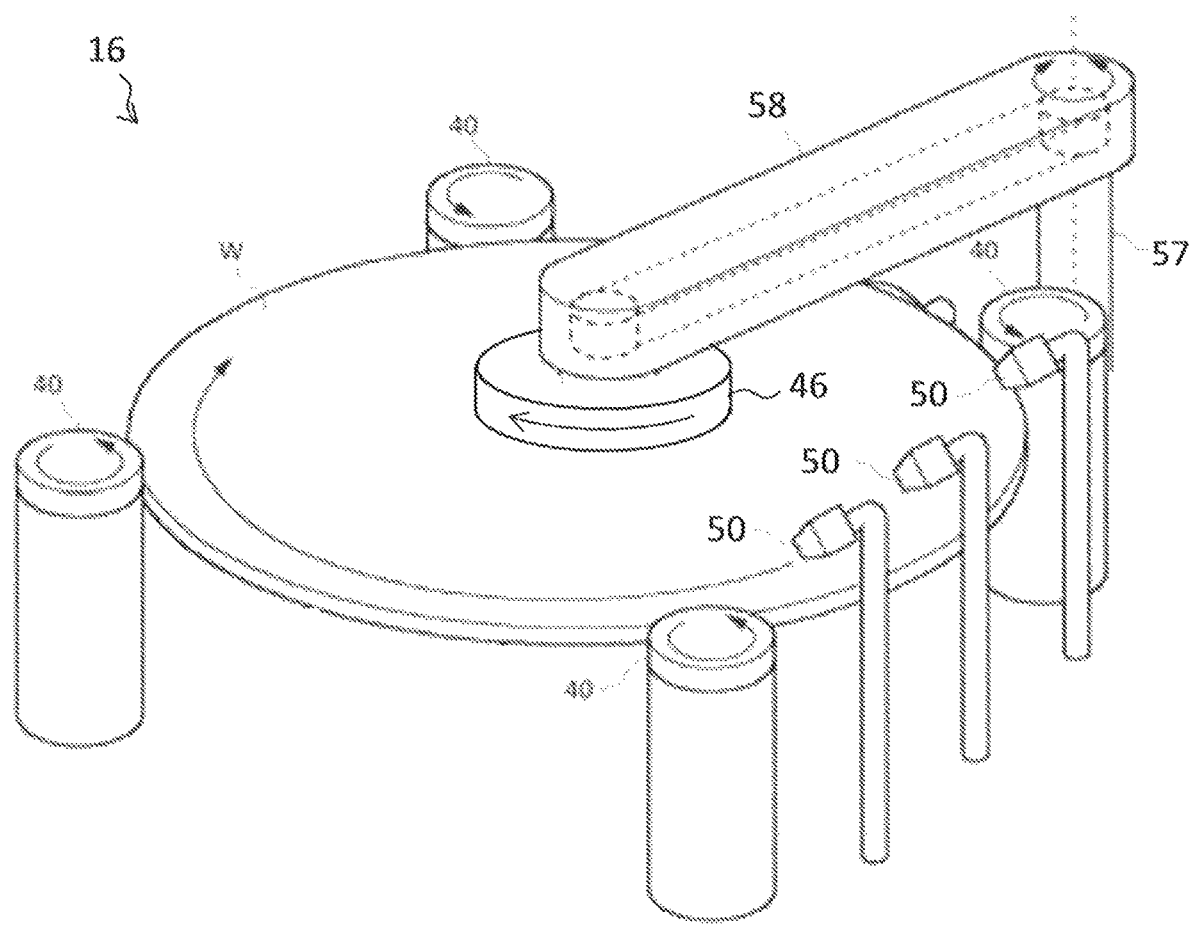
FIG. 14 is a perspective view showing a substrate cleaning device according to a second modification of the first embodiment.

In the examples shown in FIGS. 2 and 3, although the cleaning member 46 is a roll cleaning member (roll sponge) extending in a columnar shape and a long shape and made of PVA, for example, the cleaning member 46 is not limited thereto and may be a pencil cleaning member (refer to FIG. 13) with a columnar shape extending in a vertical direction or a buff cleaning/polishing member (refer to FIG. 14) with a rotation axis extending in the vertical direction.

As shown in FIG. 2, the substrate cleaning device 16 is provided with a substrate rotation mechanism 40 for supporting and rotating the substrate W, a member holder 42 disposed liftably above the substrate W supported and rotated by the substrate rotation mechanism 40, and a cleaning liquid supply unit 50 for supplying a cleaning liquid to a surface of the substrate W, and the cleaning member 46 is supported rotatably by the member holder 42.

In the example shown in the drawings, the substrate rotation mechanism 40 is a plurality of horizontally movable (four in the example shown in the drawings) spindles that support a circumferential part of the substrate W and horizontally rotate the substrate W. However, the substrate rotation mechanism 40 is not limited thereto and may be rotatable chucks. An arrow E of FIG. 2 indicates a rotation direction of the substrate W by the substrate rotation mechanism 40.

As shown in FIG. 3, the member rotation unit 96 is fixed to one end side of the member holder 42 in the longitudinal direction. As the member rotation unit 96, for example, a motor is used. The member rotation unit 96 is driven, so that the cleaning member 46 is rotated about a center axis parallel to the surface of the substrate W. An arrow F1 of FIG. 2 indicates a rotation direction of the cleaning member 46 by the member rotation unit 96.

In the examples shown in FIGS. 2 and 3, a recess 42a is formed substantially at the center of the member holder 42 along the longitudinal direction, and the load measurement unit 54 is disposed in the recess 42a and is fixed to the member holder 42. As the load measurement unit 54, for example, a load cell is used.

As the member drive unit 56, for example, an electric actuator is used. The electric actuator may be a ball screw type electric actuator, may be a rack pinion type electric actuator, or may be a direct driven type electric actuator (linear motor).

In the example shown in the drawings, the substrate cleaning device 16 is provided with a lift shaft 57 lifted by driving of the member drive unit 56 and extending in a vertical direction and a lift arm 58 having a base end connected to an upper end of the lift shaft 57 and extending in a horizontal direction, and the member holder 42 is connected to a tip of the lift arm 58 via the load measurement unit 54. Further, a tilt mechanism 70 for tilting the member holder 42 is provided between the load measurement unit 54 and the tip of the lift arm 58. The member drive unit 56 is driven, so that the member holder 42 is lifted integrally with the lift shaft 57 and the lift arm 58 above the substrate W supported and rotated by the substrate rotation mechanism 40.

The control unit 90 has a programmable logic controller (PLC) that receives an output signal of the load measurement unit 54 and a motor controller that supplies electric pulses of a predetermined number of pulses to the member drive unit 56, according to an instruction from the PLC. At least a part of the control unit 90 may be provided in the control panel 30 described above. Further, in the control unit 90, a target value of the pressing load of the cleaning member 46 is stored in advance as a "setting load", on the basis of an input from a user to the control panel 30.

By adjusting the number of pulses of the electric pulses supplied from the control unit 90 to the member drive unit 56, a movement amount (a pressing amount when the cleaning member 46 contacts the surface of the substrate W) of the member holder 42 in the vertical direction can be adjusted with high accuracy.

The member holder 42 is connected to the tip of the lift arm 58 via the load measurement unit 54. In a state where the cleaning member 46 does not contact the substrate W, a weight of the member holder 42 is measured as a tensile load by the load measurement unit 54. At the time of cleaning the substrate W, if the member holder 42 is moved downward by the member drive unit 56 and the cleaning member 46 contacts the substrate W, the tensile load applied to the load measurement unit 54 decreases according to a deformation amount of the cleaning member 46 and a decreased amount of the tensile load is matched with the pressing load applied to the substrate W by the cleaning member 46.

Thereby, the pressing load applied to the substrate W by the cleaning member 46 at the time of cleaning the substrate W is measured by the load measurement unit 54 by the decreased tensile load. The control unit 90 calculates a necessary movement amount of the cleaning member 46, on the basis of a measurement value of the load measurement unit 54, so that the pressing load of the cleaning member 46 becomes the setting load, and supplies the electric pulses of the number of pulses corresponding to the calculated movement amount to the member drive unit 56. As a result, the pressing amount of the cleaning member 46 by the member drive unit 56 is adjusted, and the pressing load for the substrate W is adjusted according to the deformation amount of the cleaning member 46.

In the present embodiment, at the time of cleaning the substrate W, the control unit 90 adjusts the pressing load of the cleaning member 46 by closed loop control of a plurality of steps (for example, two steps). That is, at the time of cleaning the substrate, the control unit 90 compares the measurement value of the load measurement unit 54 with the setting load. When a difference value is larger than a first threshold value (for example, 0.1 N) and equal to or smaller than a second threshold value (for example, 1.5 N), the control unit 90 changes (adjusts) the pressing amount of the cleaning member 46 by a first movement amount (for example, 0.01 mm) so that the difference value decreases, and when the difference value is larger than the second threshold value (for example, 1.5 N), the control unit 90 changes (adjusts) the pressing amount of the cleaning member 46 by a second movement amount (for example, 0.05 mm) larger than the first movement amount (for example, 0.01 mm) so that the difference value decreases. The control unit 90 repeats the above operation until the difference value becomes equal to or smaller than the first threshold value (0.1 N). As described above, when the pressing load of the cleaning member 46 is adjusted, the control unit 90 performs the closed loop control of the plurality of steps (for example, the two steps). As a result, it is possible to shorten a time required for adjusting the pressing load, as compared with the case of performing the closed loop control of one step.

Further, in the present embodiment, referring to FIG. 7A, the control unit 90 previously stores a correspondence relation between the pressing load and the pressing amount of the cleaning member 46 for M (6 in the example shown in the drawing) pressing loads (=2, 4, 6, 8, 10, and 12 N) as master data in a storage medium (memory). The master data may be values obtained by previously measuring the correspondence relation between the pressing load and the pressing amount of the cleaning member 46 as a guide using a dummy substrate in a substrate cleaning device maker or the like, for example.

Furthermore, referring to FIG. 7B, the control unit 90 acquires the correspondence relation between the pressing load and the pressing amount of the cleaning member 46 for N (three in the example shown in the drawing) pressing loads (=2, 6, and 10 N) among the M pressing loads as measurement data, on the basis of the measurement value of the load measurement unit 54, before cleaning the substrate W. The control unit 90 stores the acquired measurement data in the storage medium (memory).

In addition, the control unit 90 corrects each of the pressing amounts corresponding to the M pressing loads (=2, 4, 6, 8, 10, and 12 N) in the master data, on the basis of the measurement data, so that the correspondence relation between the pressing load and the pressing amount for the N pressing loads (=2, 6, and 10 N) in the master data (refer to FIG. 7A) approaches the correspondence relation between the pressing load and the pressing amount for the N pressing loads (=2, 6, and 10 N) in the measurement data (refer to FIG. 7B), and generates data for movement amount calculation (refer to FIG. 7C) showing the correspondence relation between the pressing load and the pressing amount for the M pressing loads (=2, 4, 6, 8, 10, and 12 N). Specifically, in the examples shown in FIGS. 7A to 7C, for each of the pressing loads of 2, 6, and 10 N, the pressing amount in the measurement data is 50 μm larger than the pressing amount in the master data. Therefore, the control unit 90 generates a numerical value obtained by adding 50 μm to the pressing amount in the master data for each of the pressing loads of 2, 4, 6, 8, 10, and 12 N as data for movement amount calculation. The control unit 90 stores the generated data for movement amount calculation in the storage medium (memory).

In addition, at the time of cleaning the substrate W, the control unit 90 calculates the pressing amount of the cleaning member 46 corresponding to the setting load, on the basis of the correspondence relation between the pressing load and the pressing amount in the generated data for movement amount calculation (refer to FIG. 7C). Specifically, for example, when the setting load is 8 N, instead of calculating the pressing amount necessary for realizing the setting load as 800 μm by referring to the master data (FIG. 7A), the control unit 90 calculates the pressing amount as 850 μm by referring to the data for movement amount calculation (FIG. 7C). As a result, the control unit 90 can calculate the pressing amount of the cleaning member 46 with high accuracy, as compared with the case where the pressing amount is calculated on the basis of the master data before correction.

Figure 4:
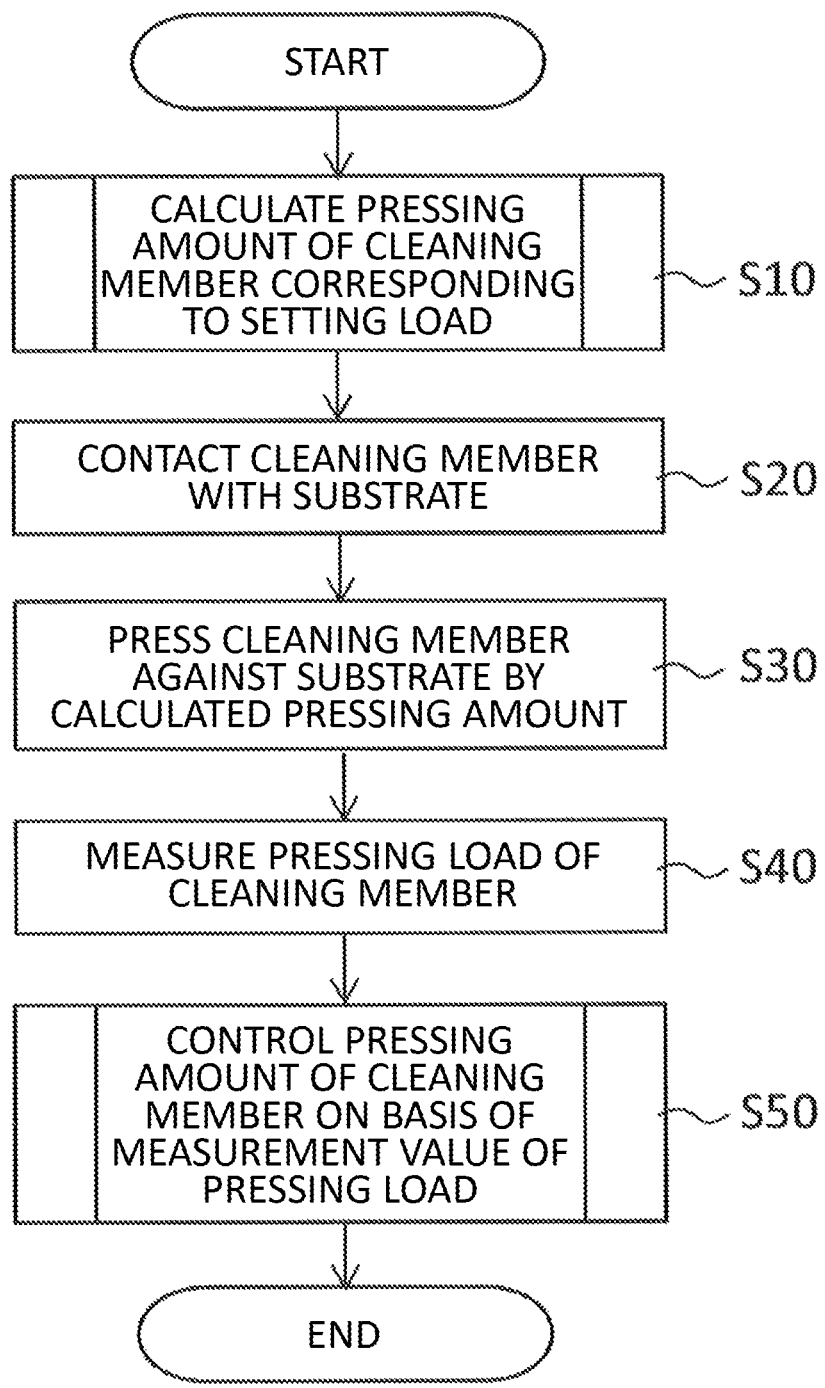
FIG. 4 is a flowchart illustrating an example of a substrate cleaning method by the substrate cleaning device according to the first embodiment.
Figure 5:
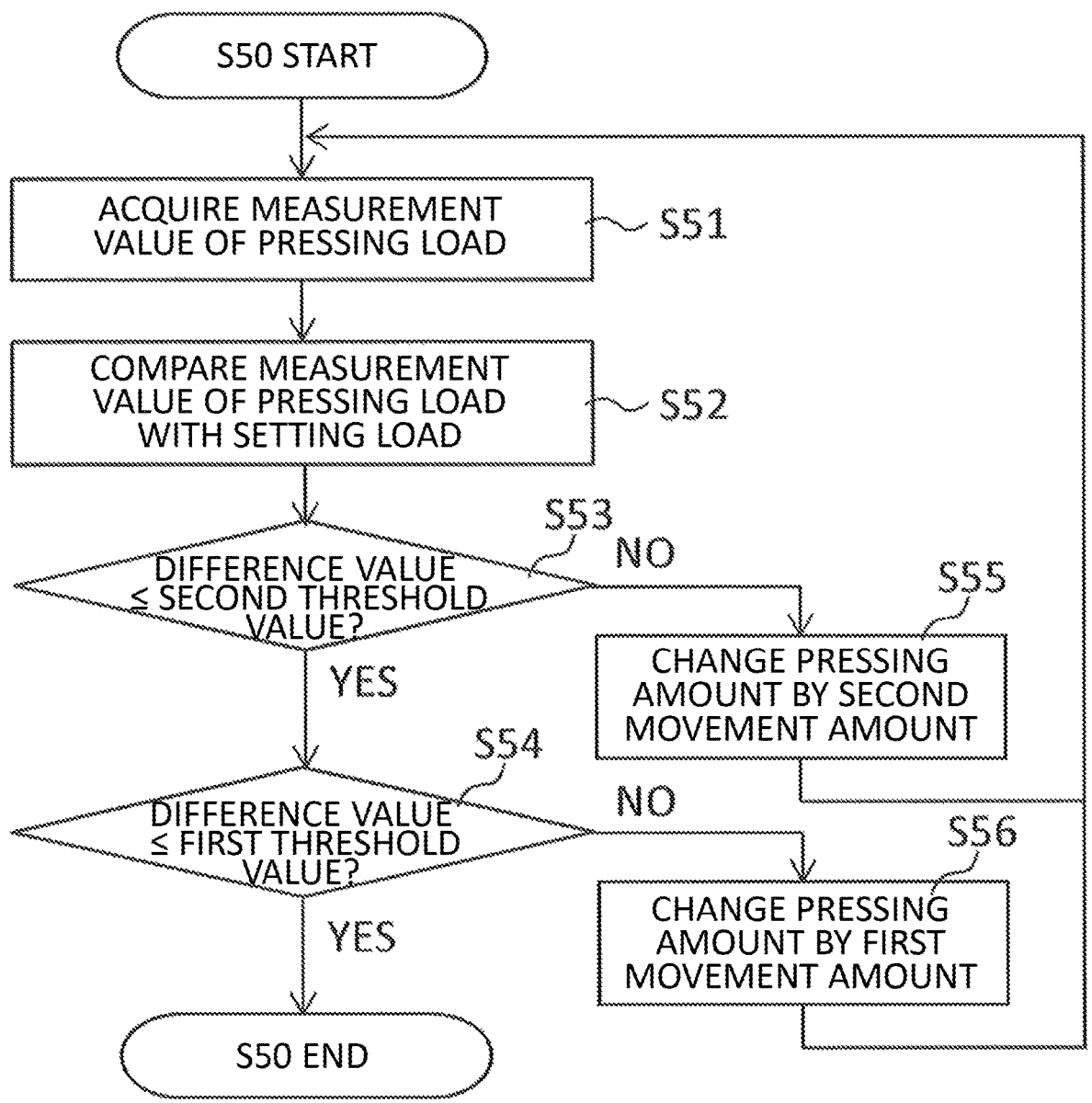
FIG. 5 is a flowchart illustrating a step of controlling a pressing amount of a cleaning member on the basis of a measurement value of a pressing load.
Figure 6:
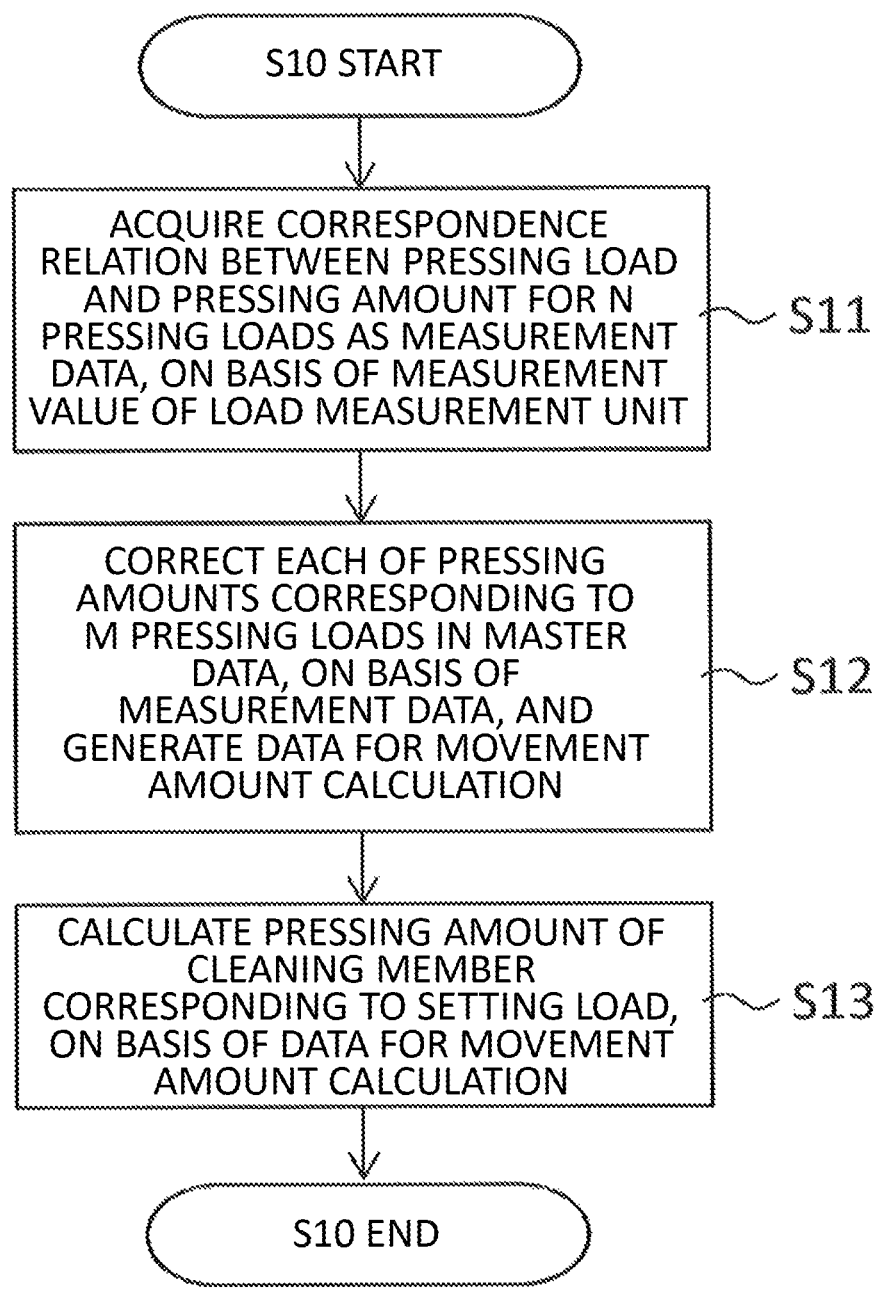
FIG. 6 is a flowchart illustrating a step of calculating a pressing amount of the cleaning member corresponding to a setting load.

Next, an example of a substrate cleaning method by the substrate cleaning device 16 having the above configuration will be described. FIG. 4 is a flowchart illustrating an example of the substrate cleaning method. FIG. 5 is a flowchart illustrating a step of controlling the pressing amount of the cleaning member 46 on the basis of the measurement value of the pressing load. FIG. 6 is a flowchart illustrating a step of calculating the pressing amount of the cleaning member 46 corresponding to the setting load.

As shown in FIG. 4, first, if the user inputs the setting load via the control panel 30, the control unit 90 calculates the pressing amount of the cleaning member 46 corresponding to the input setting load (step S10).

Specifically, for example, as shown in FIG. 6, when the control unit 90 previously stores a correspondence relation between the pressing load and the pressing amount of the cleaning member 46 for the M (6 in the example shown in the drawing) pressing loads (=2, 4, 6, 8, 10, and 12 N) as the master data in the storage medium (memory) by referring to FIG. 7A, the control unit 90 acquires the correspondence relation between the pressing load and the pressing amount of the cleaning member 46 with respect to the actual substrate W for N (3 in the example shown in the drawing) pressing loads (=2, 6, and 10 N) among the M pressing loads as measurement data, on the basis of the measurement value of the load measurement unit 54, by referring to FIG. 7B (step S11). In addition, the control unit 90 stores the acquired measurement data in the storage medium (memory).

Next, the control unit 90 corrects each of the pressing amounts corresponding to the M pressing loads (=2, 4, 6, 8, 10, and 12 N) in the master data, on the basis of the measurement data, so that the correspondence relation between the pressing load and the pressing amount for the N pressing loads (=2, 6, and 10 N) in the master data (refer to FIG. 7A) approaches the correspondence relation between the pressing load and the pressing amount for the N pressing loads (=2, 6, and 10 N) in the measurement data (refer to FIG. 7B), and generates data for movement amount calculation (refer to FIG. 7C) showing the correspondence relation between the pressing load and the pressing amount for the M pressing loads (=2, 4, 6, 8, 10, and 12 N) (step S12). The control unit 90 stores the generated data for movement amount calculation in the storage medium (memory).

In addition, the control unit 90 calculates the pressing amount of the cleaning member 46 corresponding to the setting load input by the user, on the basis of the correspondence relation between the pressing load and the pressing amount in the generated data for movement amount calculation (refer to FIG. 7C) (step S13). As a result, it is possible to calculate the pressing amount of the cleaning member 46 with high accuracy in accordance with the actual substrate W, as compared with the case where the pressing amount is calculated on the basis of the master data before correction.

As shown in FIG. 2, after calculating the pressing amount of the cleaning member 46 corresponding to the setting load, the control unit 90 supplies electric pulses of a predetermined number of pulses to the member drive unit 56, moves downward the cleaning member 46 by driving of the member drive unit 56, and contacts the cleaning member 46 with the surface of the substrate W (step S20). At this time, the cleaning member 46 only contacts the surface of the substrate W, the deformation amount of the cleaning member 46 is zero, and the pressing load of the cleaning member 46 for the substrate W is also zero.

Next, the control unit 90 supplies the electric pulses of the number of pulses according to the pressing amount calculated in step S10 to the member drive unit 56 and presses the cleaning member 46 against the surface of the substrate W by the calculated pressing amount by driving of the member drive unit 56 (step S30).

The load measurement unit 54 measures the pressing load of the cleaning member 46 for the substrate W (step S40).

In addition, the control unit 90 controls the pressing amount of the cleaning member 46 by the member drive unit 56 by the closed loop control, on the basis of the measurement value of the load measurement unit 54, so that the pressing load of the cleaning member 46 becomes the setting load input by the user (step S50).

Specifically, for example, as shown in FIG. 5, the control unit 90 acquires the measurement value of the pressing load from the load measurement unit 54 (step S51) and compares the acquired measurement value of the pressing load with the setting load (step S52).

Then, the control unit 90 determines whether or not a difference value $\Delta F$ between the measurement value of the pressing load and the setting load is equal to or smaller than the second threshold value (for example, 1.5 N) previously stored in the control unit 90 (step S53).

Then, when the difference value is larger than the second threshold value ($\Delta F > 1.5$ N), the control unit 90 supplies the electric pulses of the number of pulses corresponding to the predetermined second movement amount (for example, 0.05 mm) to the member drive unit 56 and changes (adjusts) the pressing amount of the cleaning member 46 by the second movement amount (0.05 mm) by driving of the member drive unit 56 (step S55). Then, the processing is repeated from step S51 (closed loop control of the first step).

On the other hand, when the difference value is equal to or smaller than the second threshold value ($\Delta F$ 1.5 N) (step S53: YES), the control unit 90 determines whether the difference value $\Delta F$ between the measurement value of the pressing load and the setting load is equal to or smaller than the first threshold value (for example, 0.1 N) smaller than the second threshold value previously stored in the control unit 90 (step S54).

Then, when the difference value is larger than the first threshold value ($\Delta F > 0.1$ N), the control unit 90 supplies the electric pulses of the number of pulses corresponding to the first movement amount (for example, 0.01 mm) smaller than the predetermined second movement amount to the member drive unit 56 and changes (adjusts) the pressing amount of the cleaning member 46 by the first movement amount (0.01 mm) by driving of the member drive unit 56 (step S56). Then, the processing is repeated from step S51 (closed loop control of the second step).

On the other hand, when the difference value is equal to or smaller than the first threshold value ($\Delta F \leq 0.1$ N) (step S54: YES), the processing of step S50 ends. As a result, the pressing load of the cleaning member 46 is adjusted with high accuracy so as to have substantially the same value as the setting load input by the user.

According to the present embodiment described above, when the difference value between the measurement value of the load measurement unit 54 and the setting load is larger than the first threshold value and equal to or smaller than the second threshold value, the control unit 90 changes the pressing amount of the cleaning member 46 by the first movement amount (that is, finely adjusts the pressing amount when the difference value is small). However, when the difference value is larger than the second threshold value, the control unit 90 changes the pressing amount of the cleaning member 46 by the second movement amount larger than the first movement amount (that is, roughly adjusts the pressing amount when the difference value is large). As a result, as compared with the method of changing the pressing amount of the cleaning member 46 by the first movement amount even when the difference value is larger than the second threshold value (that is, finely adjusting the pressing amount even when the difference value is large), it is possible to shorten a time until the difference value converges to the first threshold value or less, which can lead to an increase in the number of substrates processed per unit time (wph; wafer per hour). Further, as compared with the method of changing the pressing amount of the cleaning member by the second movement amount even when the difference value is equal to or smaller than the second threshold value (that is, roughly adjusting the pressing amount even when the difference value is small), the pressing amount can be controlled with high accuracy. As a result, accuracy of the pressing load can be improved.

Further, according to the present embodiment, the control unit 90 corrects the correspondence relation between the pressing load and the pressing amount in the master data (refer to FIG. 7A), on the basis of the measurement data (refer to FIG. 7B), and calculates the pressing amount of the cleaning member 46, on the basis of the data for movement amount calculation (refer to FIG. 7C) to be the correspondence relation after correction. Therefore, the control unit 90 can determine the pressing amount with high accuracy as compared with the case where the pressing amount of the cleaning member 46 is calculated on the basis of the correspondence relation (=master data) before correction. As a result, accuracy of the pressing load can be improved.

Further, according to the present embodiment, since the member drive unit 56 is the electric actuator, the pressing amount of the cleaning member 46 can be controlled with high accuracy as compared with the case where an air cylinder is adopted as the member drive unit 56. As a result, accuracy of the pressing load can be further improved.

Substrate Cleaning Device According to Second Embodiment

Figure 8:
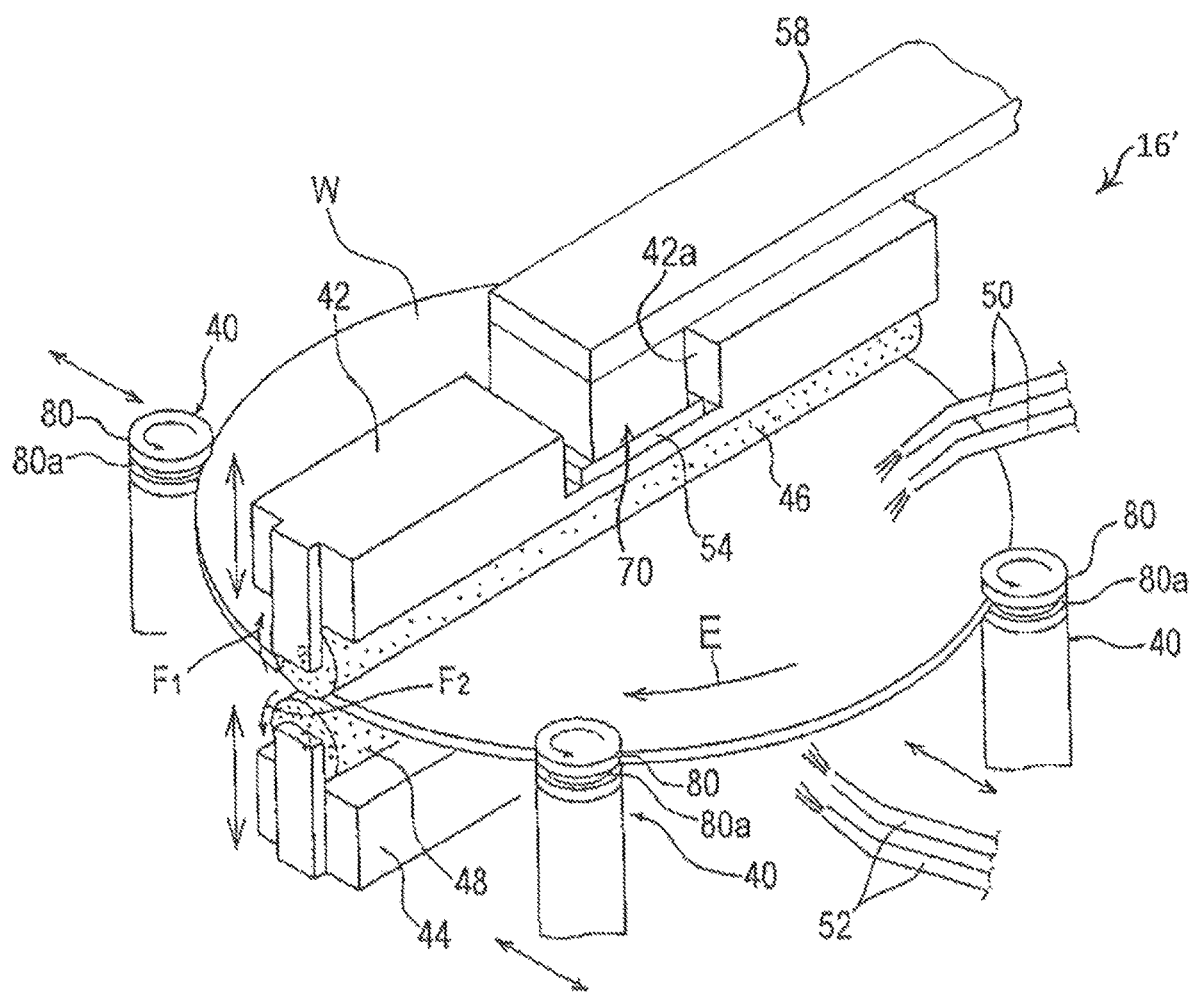
FIG. 8 is a perspective view showing a substrate cleaning device according to a second embodiment.
Figure 9:
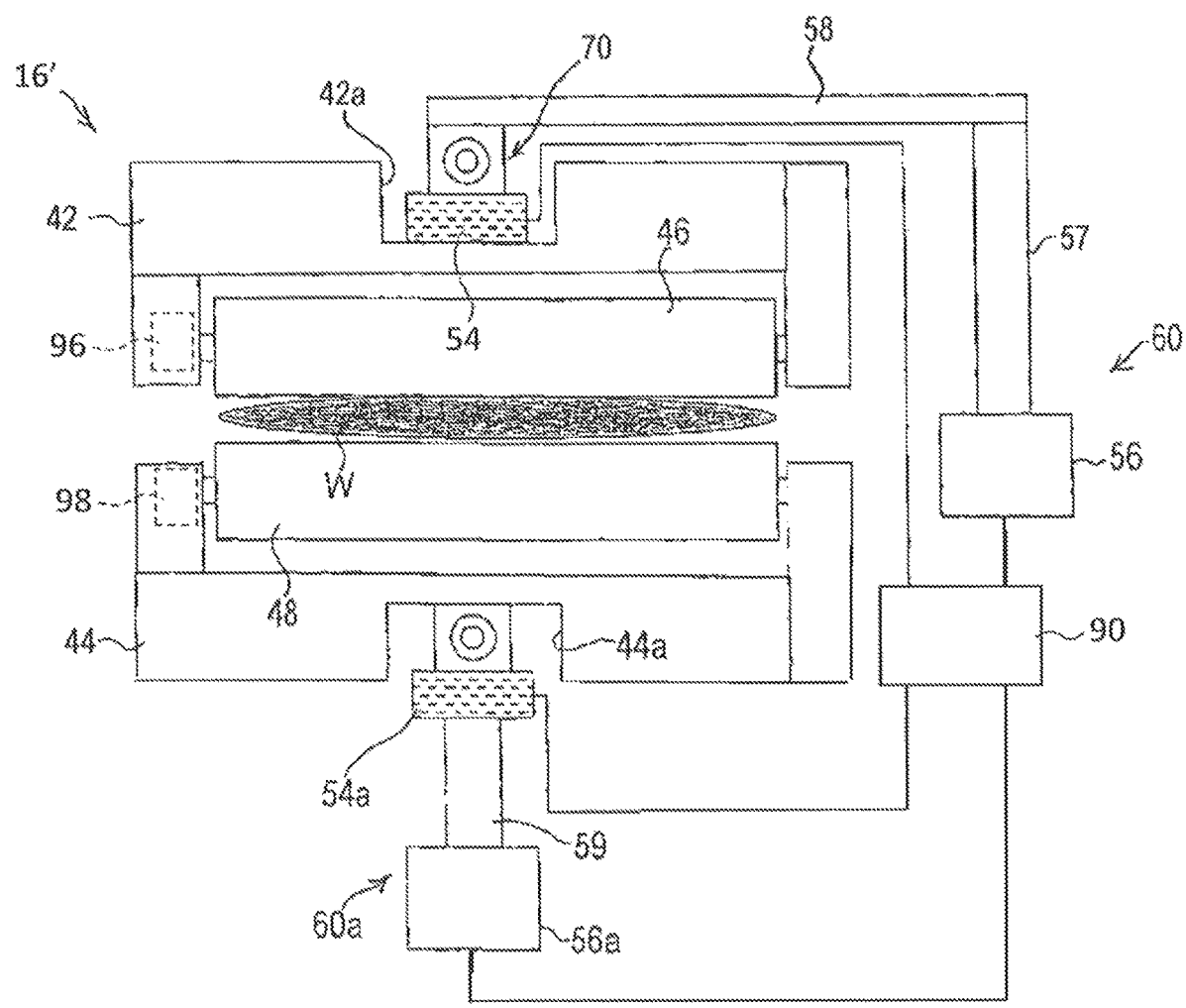
FIG. 9 is a diagram showing a schematic configuration of the substrate cleaning device according to the second embodiment.

Next, a substrate cleaning device 16' according to a second embodiment will be described. FIG. 8 is a perspective view showing the substrate cleaning device 16' according to the second embodiment and FIG. 9 is a diagram showing a schematic configuration of the substrate cleaning device 16' according to the second embodiment. The substrate cleaning device 16' according to the second embodiment may be used as a first substrate cleaning device 16a and/or a second substrate cleaning device 16b in the substrate processing apparatus 1 described above.

As shown in FIGS. 8 and 9, in addition to a configuration of a substrate cleaning device 16 according to the first embodiment described above, the substrate cleaning device 16' according to the second embodiment further has a second cleaning member 48 that cleans a second surface of a substrate W by contacting the second surface of the substrate W, a second member rotation unit 98 that rotates the second cleaning member 48, a second member drive unit 56a that presses the second cleaning member 48 against the second surface of the substrate W, and a second load measurement unit 54a that measures a pressing load of the second cleaning member 48. A control unit 90 controls each of a pressing amount of a first cleaning member 46 by a first member drive unit 56 and a pressing amount of the second cleaning member 48 by the second member drive unit 56a, on the basis of a measurement value of a first load measurement unit 54 and a measurement value of the second load measurement unit 54a, so that a pressing load of the first cleaning member 46 becomes a first setting load and a pressing load of the second cleaning member 48 becomes a second setting load.

In the present embodiment, each of the first cleaning member 46 and the second cleaning member 48 is a roll cleaning member (roll sponge) extending in a columnar shape and a long shape and made of PVA, for example. As shown in FIG. 8, the substrate cleaning device 16' is further provided with a second member holder 44 disposed liftably under the substrate W supported and rotated by a substrate rotation mechanism 40 and a second cleaning liquid supply unit 52 for supplying a cleaning liquid to the second surface of the substrate W, and the second cleaning member 48 is supported rotatably by the second member holder 44.

As shown in FIG. 9, the second member rotation unit 98 is fixed to one end side of the second member holder 44 in a longitudinal direction. As the second member rotation unit 98, for example, a motor is used. The second member rotation unit 98 is driven, so that the second cleaning member 48 is rotated about a center axis parallel to the surface of the substrate W. An arrow F2 of FIG. 8 indicates a rotation direction of the second cleaning member 48 by the second member rotation unit 98.

In the examples shown in FIGS. 8 and 9, a recess 44a is formed substantially at the center of the second member holder 44 along the longitudinal direction, and the second load measurement unit 54a is disposed in the recess 44a and is fixed to the second member holder 44. As the second load measurement unit 54a, for example, a load cell is used.

As the second member drive unit 56a, for example, an electric actuator is used. The electric actuator may be a ball screw type electric actuator, may be a rack pinion type electric actuator, or may be a direct driven type electric actuator (linear motor).

In the example shown in the drawings, the substrate cleaning device 16' is provided with a second lift shaft 59 lifted by driving of the second member drive unit 56a and extending in a vertical direction, and the second member holder 44 is connected to an upper end of the second lift shaft 59 via the second load measurement unit 54a. Further, a second tilt mechanism for tilting the second member holder 44 is provided between the second load measurement unit 54a and the second member holder 44. The second member drive unit 56a is driven, so that the second member holder 44 is lifted integrally with the second lift shaft 59 under the substrate W supported and rotated by the substrate rotation mechanism 40.

The control unit 90 has a second programmable logic controller (PLC) that receives an output signal of the second load measurement unit 54a and a second motor controller that supplies electric pulses of a predetermined number of pulses to the second member drive unit 56a, according to an instruction from the second PLC. Further, in the control unit 90, a target value of the pressing load of the second cleaning member 48 is stored in advance as a "second setting load", on the basis of an input from a user to a control panel 30.

By adjusting the number of pulses of the electric pulses supplied from the control unit 90 to the second member drive unit 56a, a movement amount (a pressing amount when the second cleaning member 48 contacts the second surface of the substrate W) of the second member holder 44 in the vertical direction can be adjusted with high accuracy.

The second member holder 44 is connected to the upper end of the second lift shaft 59 via the second load measurement unit 54a. In a state where the second cleaning member 48 does not contact the substrate W, a weight of the second member holder 44 is measured as a compressive load by the second load measurement unit 54a. At the time of cleaning the substrate W, if the second member holder 44 is moved upward by the second member drive unit 56a and the second cleaning member 48 contacts the substrate W, the compressive load applied to the second load measurement unit 54a increases according to a deformation amount of the second cleaning member 48 and an increased amount of the compressive load is matched with the pressing load applied to the substrate W by the second cleaning member 48.

Thereby, the pressing load applied to the substrate W by the second cleaning member 48 at the time of cleaning the substrate W is measured by the second load measurement unit 54a by the increased compressive load. The control unit 90 calculates a necessary movement amount of the second cleaning member 48, on the basis of a measurement value of the second load measurement unit 54a, so that the pressing load of the second cleaning member 48 becomes the second setting load, and supplies the electric pulses of the number of pulses corresponding to the calculated movement amount to the second member drive unit 56a. As a result, the pressing amount of the second cleaning member 48 by the second member drive unit 56a is adjusted, and the pressing load for the substrate W is adjusted according to the deformation amount of the second cleaning member 48.

Figure 12A:
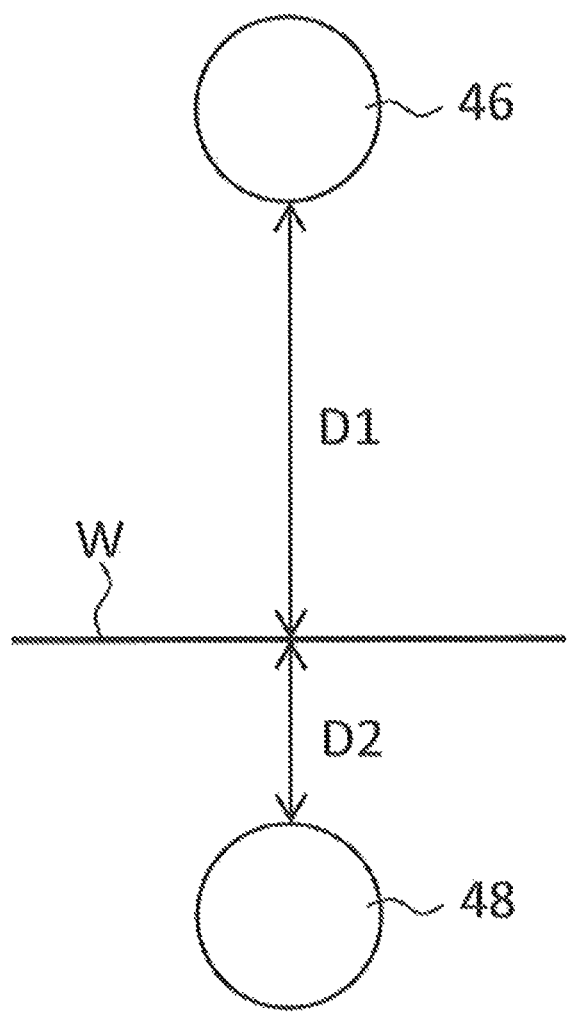
FIGS. 12A to 12C are diagrams illustrating a step of contacting the first cleaning member and the second cleaning member with the substrate.
Figure 12B:
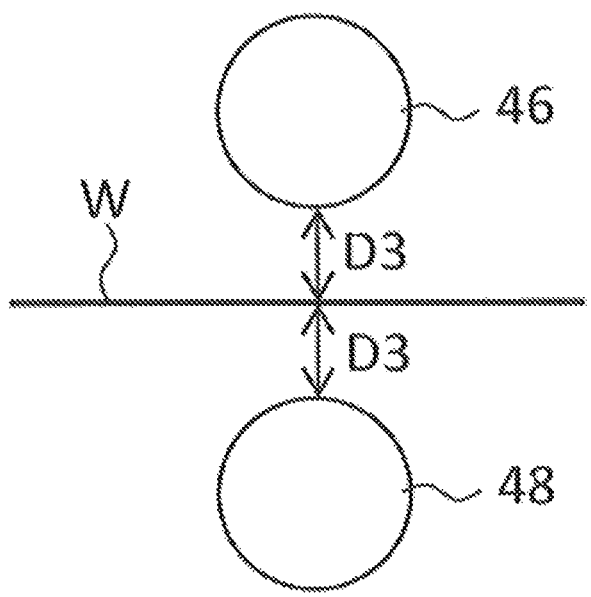

In the present embodiment, the control unit 90 is configured to execute a first step of controlling the first member drive unit 56 and the second member drive unit 56a so that the first cleaning member 46 moves at a first movement speed V1 from a first initial position separated from the first surface of the substrate W by a first distance D1 to a first proximity position separated from the first surface by a third distance D3 and the second cleaning member 48 moves at a second movement speed V2 from a second initial position separated from the second surface of the substrate W by a second distance D2 shorter than the first distance D1 to a second proximity position separated from the second surface by the third distance D3, by referring to FIGS. 12A and 12B, before cleaning the substrate W.

Figure 12C:
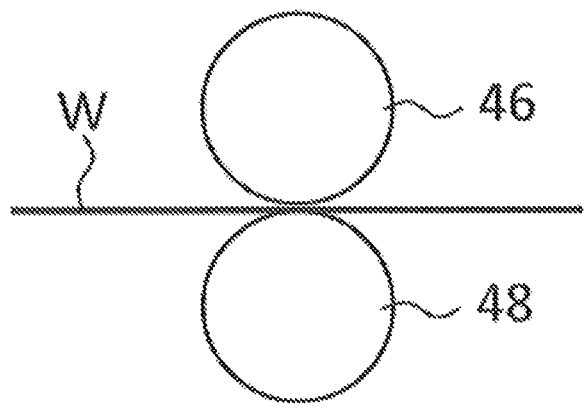

Further, the control unit 90 is configured to execute a second step of controlling the first member drive unit 56 and the second member drive unit 56a so that the first cleaning member 46 and the second cleaning member 48 simultaneously start moving at a third movement speed V3 lower than the first movement speed V1 and simultaneously contact the first surface and the second surface of the substrate W, respectively, by referring to FIGS. 12B and 12C, after the first step. By moving the first cleaning member 46 and the second cleaning member 48 respectively disposed at the first proximity position and the second proximity position having the same distances from the substrate W, symmetrically with respect to the substrate W, and simultaneously contacting the first cleaning member 46 and the second cleaning member 48 with the substrate W, it is possible to simultaneously and accurately position the first cleaning member 46 and the second cleaning member 48 on the surfaces of the substrate W.

Further, the control unit 90 is configured to determine the second movement speed V2 of the second cleaning member 48 by the second member drive unit 56a, on the basis of the first movement speed V1 of the first cleaning member 46 by the first member drive unit 56, so that the first cleaning member 46 disposed at the first initial position and the second cleaning member 48 disposed at the second initial position simultaneously start the moving and the second cleaning member 48 reaches the second proximity position at timing identical to timing when the first cleaning member 46 reaches the first proximity position, before the first step. Specifically, for example, the control unit 90 determines the second movement speed V2 of the second cleaning member 48 by the second member drive unit 56a by a calculation formula of $V2=V1 \times (D2-D3)/(D1-D3)$. By determining the second movement speed V2 of the second cleaning member 48 disposed at the second initial position relatively close to the substrate W, on the basis of the first movement speed V1 of the first cleaning member 46 disposed at the first initial position relatively far from the substrate W, it is possible to shorten a time required for causing the first cleaning member 46 and the second cleaning member 48 to reach the first proximity position and the second proximity position, respectively.

Figure 10:
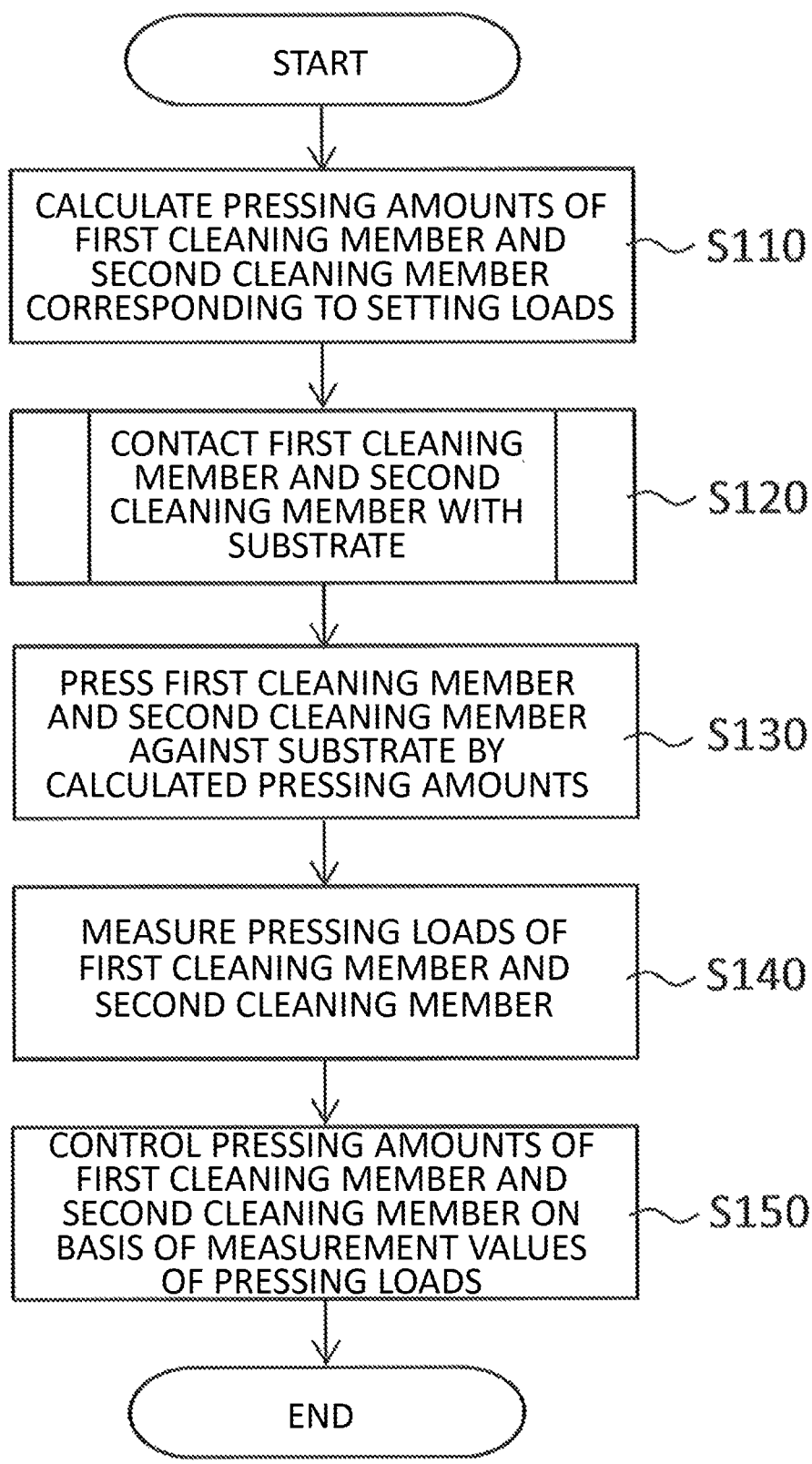
FIG. 10 is a flowchart illustrating an example of a substrate cleaning method by the substrate cleaning device according to the second embodiment.
Figure 11:
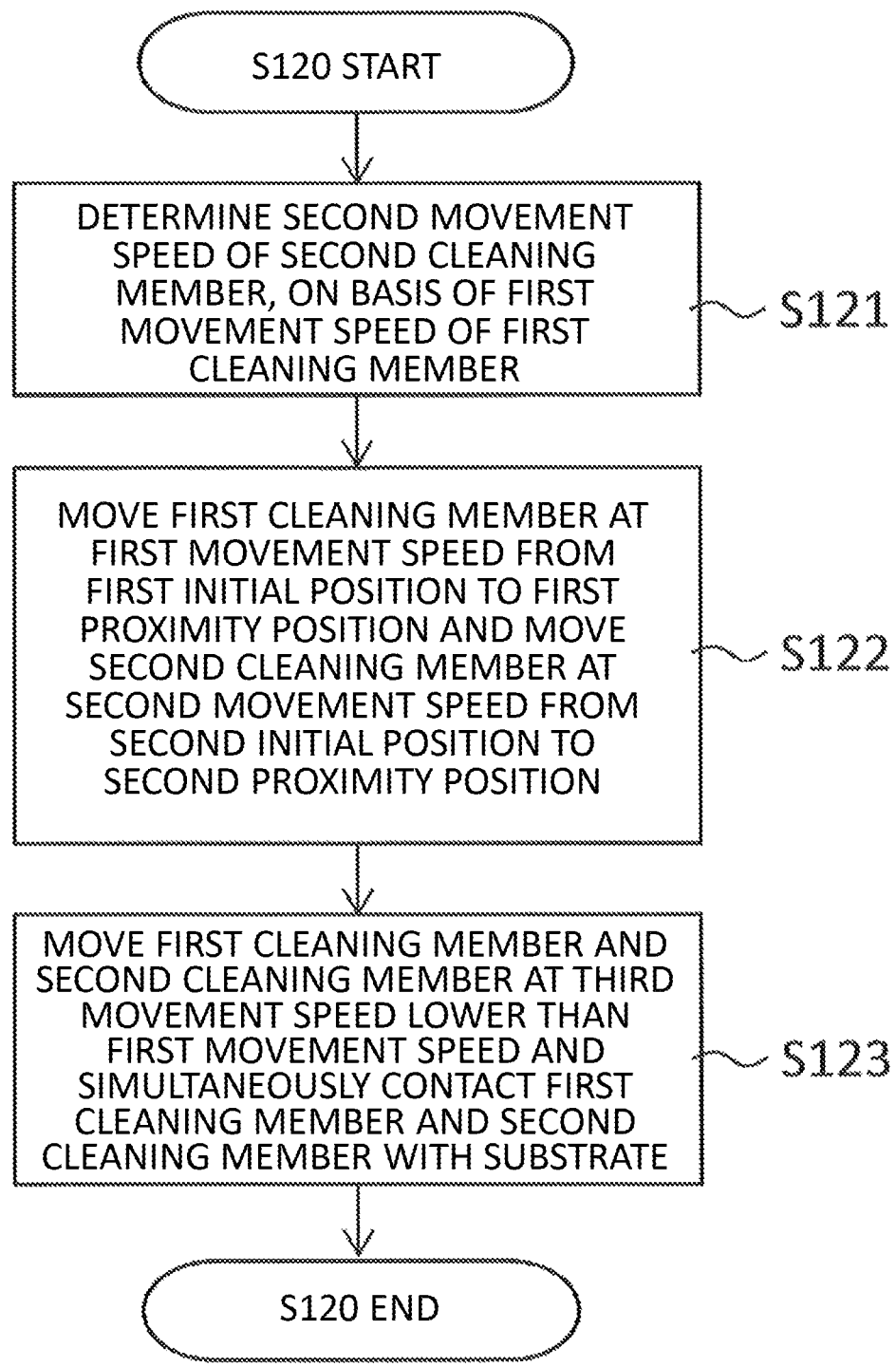
FIG. 11 is a flowchart illustrating a step of contacting a first cleaning member and a second cleaning member with a substrate.

Next, an example of a substrate cleaning method by the substrate cleaning device 16' having the above configuration will be described. FIG. 10 is a flowchart illustrating an example of the substrate cleaning method. FIG. 11 is a flowchart illustrating a step of contacting the first cleaning member 46 and the second cleaning member 48 with the substrate W.

As shown in FIG. 10, first, if the user inputs the first setting load and the second setting load via the control panel 30, the control unit 90 calculates each of the pressing amounts of the first cleaning member 46 and the second cleaning member 48 corresponding to the input setting loads (step S110).

Next, the control unit 90 supplies electric pulses of a predetermined number of pulses to the first member drive unit 56, moves downward the first cleaning member 46 by driving of the first member drive unit 56, and contacts the first cleaning member 46 with the first surface of the substrate W, and the control unit 90 supplies electric pulses of a predetermined number of pulses to the second member drive unit 56a, moves upward the second cleaning member 48 by driving of the second member drive unit 56a, and contacts the second cleaning member 48 with the second surface of the substrate W (step S120).

Specifically, for example, as shown in FIG. 11, the control unit 90 determines the second movement speed V2 of the second cleaning member 48 by the second member drive unit 56a, on the basis of the first movement speed V1 of the first cleaning member 46 by the first member drive unit 56 (step S121), so that the first cleaning member 46 disposed at the first initial position and the second cleaning member 48 disposed at the second initial position simultaneously start the moving (refer to FIG. 12A) and the second cleaning member 48 reaches the second proximity position at timing identical to timing when the first cleaning member 46 reaches the first proximity position (refer to FIG. 12B).

Next, referring to FIGS. 12A and 12B, the control unit 90 controls each of the first member drive unit 56 and the second member drive unit 56a, moves the first cleaning member 46 at the first movement speed V1 (for example, a maximum speed by the first member drive unit 56) from the first initial position to the first proximity position, and moves the second cleaning member 48 at the second movement speed V2 determined in step S121 from the second initial position to the second proximity position (step S122). As a result, it is possible to shorten a time required for causing the first cleaning member 46 and the second cleaning member 48 to reach the first proximity position and the second proximity position, respectively.

Next, referring to FIGS. 12B and 12C, the control unit 90 controls each of the first member drive unit 56 and the second member drive unit 56a, simultaneously starts moving the first cleaning member 46 and the second cleaning member 48 at the third movement speed V3 lower than the first movement speed V1, and simultaneously contacts the first cleaning member 46 and the second cleaning member 48 with the first surface and the second surface of the substrate W, respectively (step S123). As a result, it is possible to simultaneously and accurately position the first cleaning member 46 and the second cleaning member 48 on the surfaces of the substrate W.

At this time, the first cleaning member 46 only contacts the first surface of the substrate W, the deformation amount of the first cleaning member 46 is zero, and the pressing load of the first cleaning member 46 for the substrate W is also zero. Similarly, the second cleaning member 48 only contacts the second surface of the substrate W, the deformation amount of the second cleaning member 48 is zero, and the pressing load of the second cleaning member 48 for the substrate W is also zero.

Next, the control unit 90 supplies the electric pulses of the number of pulses according to the pressing amounts calculated in step S110 to the first member drive unit 56 and the second member drive unit 56a and presses the first cleaning member 46 and the second cleaning member 48 against the first surface and the second surface of the substrate W by the calculated pressing amounts by the first member drive unit 56 and the second member drive unit 56a (step S130).

The first load measurement unit 54 and the second load measurement unit 54a respectively measure the pressing loads of the first cleaning member 46 and the second cleaning member 48 for the substrate W (step S140).

Then, the control unit 90 controls the pressing amounts of the first cleaning member 46 and the second cleaning member 48 by the first member drive unit 56 and the second member drive unit 56a by closed loop control, on the basis of the measurement values of the first load measurement unit 54 and the second load measurement unit 54a, so that the pressing load of the first cleaning member 46 becomes the first setting load input by the user and the pressing load of the second cleaning member 48 becomes the second setting load input by the user (step S150). As a result, the pressing loads of the first cleaning member 46 and the second cleaning member 48 are adjusted with high accuracy so as to have substantially the same values as the first and second setting loads input by the user.

According to the present embodiment described above, referring to FIGS. 12A and 12B, the second movement speed of the second cleaning member 48 disposed at the second initial position relatively close to the substrate W is determined on the basis of the first movement speed of the first cleaning member 46 disposed at the first initial position relatively far from the substrate W. Therefore, it is possible to shorten a time required for causing the first cleaning member 46 and the second cleaning member 48 to reach the first proximity position and the second proximity position, respectively. As a result, it is possible to increase the number of substrates processed per unit time (wph; wafer per hour).

Further, according to the present embodiment, referring to FIGS. 12B and 12C, the first cleaning member 46 and the second cleaning member 48 respectively disposed at the first proximity position and the second proximity position having the same distances from the substrate W are moved symmetrically with respect to the substrate W and the first cleaning member 46 and the second cleaning member 48 are simultaneously contacted with the substrate W. Therefore, it is possible to simultaneously and accurately position the first cleaning member 46 and the second cleaning member 48 on the surfaces of the substrate W. As a result, subsequent pressing amount control can be performed with high accuracy, and accuracy of the pressing load can be improved.

Further, according to the present embodiment, since each of the first member drive unit 56 and the second member drive unit 56a is the electric actuator, the pressing amounts of the first cleaning member 46 and the second cleaning member 48 can be controlled with high accuracy, as compared with the case where air cylinders are adopted as the first member drive unit 56 and the second member drive unit 56a. As a result, accuracy of the pressing load can be further improved.

Although the embodiments and the modifications of the present technology are described by the examples, a range of the present technology is not limited thereto, and changes and modifications according to objects can be made within a range described in claims. Further, the embodiments and the modifications can be appropriately combined within a range in which processing contents are not contradicted.

What is claimed is:

1. A substrate cleaning method comprising:
a step of causing a control unit to calculate a calculated pressing amount of a cleaning member corresponding to a setting load;
a step of causing a member drive unit to press the cleaning member against a substrate by the calculated pressing amount;
a step of causing a load measurement unit to measure a measurement value of an applied pressing load of the cleaning member; and
a step of causing a control unit to control an applied pressing amount of the cleaning member by the member drive unit, on the basis of the measurement value of the load measurement unit, so that the applied pressing load of the cleaning member becomes the setting load, wherein
the control unit stores a correspondence relation between pressing loads and pressing amounts of the cleaning member for M different stored pressing loads as master data, and
in the step of calculating the calculated pressing amount:
the control unit acquires the correspondence relation between the pressing loads and the pressing amounts of the cleaning member for N different pressing loads among the M different stored pressing loads as measurement data, on the basis of the measurement value of the load measurement unit, where N is smaller than M,
the control unit corrects each of the pressing amounts corresponding to the M different stored pressing loads in the master data, on the basis of the measurement data, so that the correspondence relation between the pressing loads and the pressing amounts for the N different pressing loads in the master data approaches the correspondence relation between the pressing loads and the pressing amounts for the N different pressing loads in the measurement data, and generates data for a movement amount calculation showing the correspondence relation between the pressing loads and the pressing amounts for the M different stored pressing loads, and
the control unit calculates the calculated pressing amount of the cleaning member corresponding to the setting load, on the basis of the correspondence relation between the pressing loads and the pressing amounts in the data for movement amount calculation.

2. The substrate cleaning method according to claim 1, wherein
the cleaning member is any one member of the group consisting of a roll cleaning member, a pencil cleaning member, and a buff cleaning/polishing member.

3. A substrate cleaning method comprising:
a step of causing a first member drive unit to contact a first cleaning member with a first surface of a substrate and causing a second member drive unit to contact a second cleaning member with a second surface of the substrate;
a step of causing the first member drive unit to press the first cleaning member against the first surface of the substrate and causing the second member drive unit to press the second cleaning member against the second surface of the substrate;
a step of causing a first load measurement unit to measure a pressing load of the first cleaning member and causing a second load measurement unit to measure a pressing load of the second cleaning member; and
a step of causing a control unit to control each of a pressing amount of the first cleaning member by the first member drive unit and a pressing amount of the second cleaning member by the second member drive unit, on the basis of a measurement value of the first load measurement unit and a measurement value of the second load measurement unit, so that the pressing load of the first cleaning member becomes a first setting load and the pressing load of the second cleaning member becomes a second setting load, wherein the step of causing a first member drive unit to contact the first cleaning member and the second cleaning member with the substrate includes:

a first step of causing the control unit to control the first member drive unit and the second member drive unit so that the first cleaning member moves at a first movement speed from a first initial position separated from the first surface of the substrate by a first distance to a first proximity position separated from the first surface of the substrate by a third distance and the second cleaning member moves at a second movement speed from a second initial position separated from the second surface of the substrate by a second distance shorter than the first distance to a second proximity position separated from the second surface of the substrate by the third distance, and a second step of causing the control unit to control the first member drive unit and the second member drive unit so that the first cleaning member and the second cleaning member simultaneously start moving at a third movement speed lower than the first movement speed and simultaneously contact the first surface of the substrate and the second surface of the substrate, respectively, and the control unit determines, before the first step, the second movement speed of the second cleaning member, on the basis of the first movement speed of the first cleaning member, so that the first cleaning member disposed at the first initial position and the second cleaning member disposed at the second initial position simultaneously start the moving and the second cleaning member reaches the second proximity position at timing identical to timing when the first cleaning member reaches the first proximity position.

4. The substrate cleaning method according to claim 3, wherein
each of the first cleaning member and the second cleaning member is a roll cleaning member.

5. The substrate cleaning method according to claim 3, wherein
each of the first member drive unit and the second member drive unit is an electric actuator.

* * * * *